(12) United States Patent
Ishii et al.

(10) Patent No.: US 10,799,917 B2
(45) Date of Patent: Oct. 13, 2020

(54) SUBSTRATE PROCESSING APPARATUS AND SUBSTRATE PROCESSING METHOD

(71) Applicants: EBARA CORPORATION, Tokyo (JP); TOSHIBA MEMORY CORPORATION, Tokyo (JP)

(72) Inventors: Yu Ishii, Tokyo (JP); Hiroyuki Kawasaki, Tokyo (JP); Kenichi Nagaoka, Tokyo (JP); Kenya Ito, Tokyo (JP); Masako Kodera, Kanagawa-ken (JP); Hiroshi Tomita, Kanagawa-ken (JP); Takeshi Nishioka, Kanagawa-ken (JP)

(73) Assignees: EBARA CORPORATION, Tokyo (JP); Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/405,559

(22) Filed: May 7, 2019

(65) Prior Publication Data
US 2019/0262869 A1    Aug. 29, 2019

Related U.S. Application Data

(62) Division of application No. 13/772,031, filed on Feb. 20, 2013, now Pat. No. 10,328,465.

(30) Foreign Application Priority Data

Feb. 21, 2012 (JP) .................................. 2012-35365

(51) Int. Cl.
| | |
|---|---|
| *B08B 1/00* | (2006.01) |
| *H01L 21/67* | (2006.01) |
| *H01L 21/687* | (2006.01) |

(52) U.S. Cl.
CPC ........ *B08B 1/001* (2013.01); *H01L 21/67046* (2013.01); *H01L 21/67051* (2013.01); *H01L 21/68728* (2013.01)

(58) Field of Classification Search
CPC ............... B08B 1/001; H01L 21/67051; H01L 21/68728; H01L 21/67046; H01L 21/67132; H01L 21/68764
See application file for complete search history.

(56) References Cited

U.S. PATENT DOCUMENTS

| | | |
|---|---|---|
| 4,656,790 A | 4/1987 | Mukai et al. |
| 4,811,443 A | 3/1989 | Nishizawa |
| (Continued) | | |

FOREIGN PATENT DOCUMENTS

| | | |
|---|---|---|
| EP | 0582206 A2 | 2/1994 |
| JP | 61-203643 A | 9/1986 |
| (Continued) | | |

*Primary Examiner* — Alexander Markoff
(74) *Attorney, Agent, or Firm* — BakerHostetler

(57) ABSTRACT

A substrate processing apparatus removes foreign substances from a substrate at high removal efficiency. The substrate processing apparatus includes: a scrubber to perform surface processing of the substrate by bringing a scrubbing member into sliding contact with a first surface of the substrate, a hydrostatic support mechanism for supporting a second surface of the substrate via fluid pressure without contacting the substrate, the second surface being an opposite surface of the first surface, a cleaner to clean the processed substrate, and a dryer to dry the cleaned substrate. The scrubber brings the scrubbing member into sliding contact with the first surface while rotating the scrubbing member about a central axis of the scrubber.

20 Claims, 39 Drawing Sheets

(56) References Cited

U.S. PATENT DOCUMENTS

| | | |
|---|---|---|
| 5,485,644 A | 1/1996 | Shinbara et al. |
| 5,868,857 A | 2/1999 | Moinpour et al. |
| 6,062,959 A | 5/2000 | Weldon et al. |
| 6,076,686 A | 6/2000 | Mahanpour et al. |
| 6,175,983 B1 | 1/2001 | Hirose et al. |
| 6,197,182 B1 | 3/2001 | Kaufman et al. |
| 6,231,427 B1 | 5/2001 | Talieh et al. |
| 6,286,525 B1 | 9/2001 | Nishimura et al. |
| 6,352,596 B2 | 3/2002 | Beardsley et al. |
| 6,475,293 B1 | 11/2002 | Moinpour et al. |
| 6,558,239 B2 | 5/2003 | Kunisawa et al. |
| 6,588,043 B1 | 7/2003 | Frost et al. |
| 7,367,873 B2 | 5/2008 | Ishii et al. |
| 7,997,289 B1 | 8/2011 | Frost et al. |
| 8,210,905 B2 | 7/2012 | Sakairi et al. |
| 8,540,551 B2 | 9/2013 | Brown et al. |
| 10,328,465 B2 * | 6/2019 | Ishii ................. B08B 1/001 |
| 2001/0052159 A1 | 12/2001 | Monipour et al. |
| 2003/0017787 A1 | 1/2003 | Weldon et al. |
| 2005/0284369 A1 * | 12/2005 | Miya ................. H01L 21/67751 118/500 |
| 2006/0009125 A1 | 1/2006 | Okura |
| 2006/0191556 A1 * | 8/2006 | Nakazawa ......... H01L 21/67017 134/2 |
| 2007/0181432 A1 | 8/2007 | Shirakashi et al. |
| 2008/0314870 A1 * | 12/2008 | Inoue ................. B08B 1/04 216/38 |
| 2010/0144248 A1 | 6/2010 | Futamura |
| 2012/0111361 A1 * | 5/2012 | Treichel ............... A46B 13/001 134/6 |
| 2013/0213437 A1 * | 8/2013 | Ishii ........................ B08B 1/001 134/6 |
| 2013/0217228 A1 * | 8/2013 | Kodera ............ H01L 21/02057 438/689 |
| 2015/0000055 A1 | 1/2015 | Togawa et al. |
| 2015/0000056 A1 | 1/2015 | Togawa et al. |
| 2016/0358768 A1 * | 12/2016 | Kodera ................. B24B 37/042 |

FOREIGN PATENT DOCUMENTS

| | | |
|---|---|---|
| JP | 63-251166 A | 10/1988 |
| JP | H08-264626 A | 10/1996 |
| JP | 08-339979 A | 12/1996 |
| JP | 09-092633 A | 4/1997 |
| JP | 09-262747 A | 10/1997 |
| JP | 10-189511 A | 7/1998 |
| JP | 2000-176386 A | 6/2000 |
| JP | 2000-296368 A | 10/2000 |
| JP | 2003-007666 A | 1/2003 |
| JP | 2010-080477 A | 4/2010 |
| JP | 2010-087338 A | 4/2010 |
| JP | 2010-278103 A | 12/2010 |
| JP | 2012-028697 A | 2/2012 |
| TW | 348278 | 12/1998 |
| TW | 348279 | 12/1998 |
| TW | 200922701 A | 6/2009 |
| TW | 201139057 A | 11/2011 |

\* cited by examiner

SUBSTRATE PROCESSING APPARATUS AND SUBSTRATE PROCESSING METHOD

CROSS REFERENCE TO RELATED APPLICATIONS

This application is a Divisional of U.S. application Ser. No. 13/772,031 filed Feb. 20, 2013 which claims priority to Japanese Patent Application No. 2012-35365, filed on Feb. 21, 2012, the entire contents of which are hereby incorporated by reference.

BACKGROUND OF THE INVENTION

Field of the Invention

The present invention relates to an apparatus and a method for processing a front-side surface and/or a backside surface of a substrate, such as a wafer, which requires high cleanliness.

Description of the Related Art

In recent years, various devices including memory circuits, logic circuits, and image sensors (e.g., complimentary metal-oxide-semiconductor (CMOS) sensors) have become more and more highly integrated. In the processes of fabricating these devices, foreign substances, such as fine particles and dusts, may be attached to the devices. The foreign substances attached to the devices could be a cause of a short circuit between interconnects and a malfunction of the circuit. Therefore, in order to increase reliability of the devices, it is necessary to clean a wafer on which the devices are fabricated so as to remove the foreign substances from the wafer.

The foreign substances, such as fine particles and dusts, may also be attached to a backside surface of the wafer, i.e., a bare silicon surface. The foreign substances on the backside surface of the wafer may cause the wafer to be separated from a stage reference surface of an exposure apparatus and/or may cause the wafer surface to tilt with respect to the stage reference surface, resulting in a patterning shift or a focal length error. In order to prevent such problems, it is necessary to remove the foreign substances from the backside surface of the wafer as well.

There has recently been developed a patterning apparatus based on nanoimprint technology, rather than the optical exposure technology. In this nanoimprint technology, a mold, which has predefined interconnect patterns, is pressed against a resin material formed on a wafer to transfer the interconnect patterns to the resin material. In such nanoimprint technology, it is required to remove the foreign substances existing on the surface of the wafer in order to avoid transfer of unwanted spots between the mold and the wafer and also between wafers.

It has been customary to scrub the wafer with a pen-shaped brush or a roll sponge while rotating the wafer. However, such a cleaning technique has a low capability of removing the foreign substances. In particular, it is difficult for the conventional cleaning technique to remove the foreign substances having a size of 100 nm or more.

SUMMARY OF THE INVENTION

The present invention has been made in view of the above. It is therefore an object of the present invention to provide a substrate processing apparatus and a substrate processing method which are capable of removing foreign substances from a front-side surface and/or a backside surface of a substrate, such as a wafer, at high removal efficiency. More particularly, it is an object of the present invention to provide a substrate processing apparatus and a substrate processing method which are capable of cleaning and drying the substrate after removing the foreign substances from the substrate.

One aspect of the present invention for achieving the above object provides a substrate processing apparatus, including: a scrubber configured to perform surface processing of a substrate by bringing a scrubbing member into sliding contact with a first surface of the substrate; a hydrostatic support mechanism having a substrate support surface for supporting a second surface of the substrate via fluid pressure without contacting the substrate, the second surface being an opposite surface of the first surface; a cleaner configured to clean the substrate processed by the scrubber; and a dryer configured to dry the substrate cleaned by the cleaner. The scrubber is configured to bring the scrubbing member into sliding contact with the first surface of the substrate while rotating the scrubbing member about a central axis of the scrubber.

Another aspect of the present invention provides a substrate processing method, including: performing surface processing of a substrate by bringing a scrubbing member into sliding contact with a first surface of the substrate while supporting a second surface of the substrate by fluid pressure in a non-contact manner, the second surface being an opposite surface of the first surface; cleaning the substrate that has been subjected to the surface processing; and drying the cleaned substrate.

According to embodiments of the present invention, the second surface of the substrate (e.g., a front-side surface of the substrate) is supported by the hydrostatic support mechanism. Therefore, the scrubber can apply a relatively high load to the first surface of the substrate (e.g., a backside surface of the substrate). Under such a high load, the scrubbing member of the scrubber is placed in sliding contact with the first surface to thereby slightly scrape off the first surface. Consequently, the scrubber can remove the foreign substances firmly attached to the first surface. In particular, the scrubber can remove the foreign substances having a size of 100 nm or more with greatly improved efficiency. Moreover, since the second surface of the substrate is supported by the hydrostatic support mechanism which does not contact the substrate, the scrubber can remove the foreign substances from the first surface without causing damage to devices formed on the second surface.

Furthermore, according to embodiments of the present invention, the substrate processing apparatus can remove the foreign substances from the substrate, clean the substrate, and dry the substrate. Therefore, it is not necessary to transport the substrate to other sites for these processes. That is, the substrate can be scrubbed, cleaned, and dried successively in one processing chamber, so that debris and mists (e.g., processing liquid and cleaning liquid) are prevented from spreading out. As a consequence, the substrate processing apparatus can be installed in a clean environment, such as a clean room.

DETAILED DESCRIPTION OF THE PREFERRED EMBODIMENTS

Figure 1A:
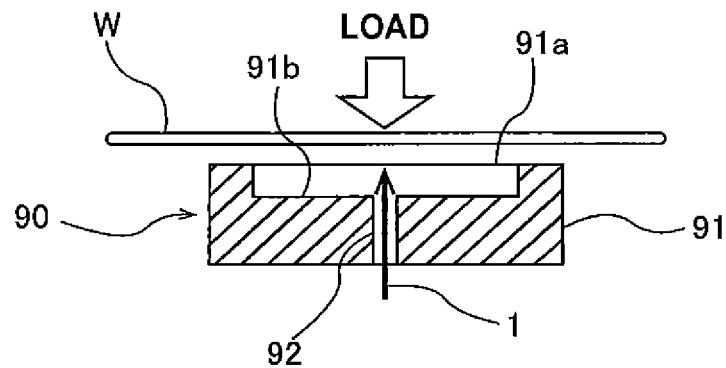
FIGS. 1A, 1B, and 1C are schematic views each showing a substrate processing apparatus according to an embodiment of the present invention.

Embodiments of a substrate processing apparatus according to the present invention will be described below with reference to the drawings. Identical or corresponding parts are denoted by identical reference numerals in FIGS. 1 to 39, and will not be described in duplication.

Figure 1B:
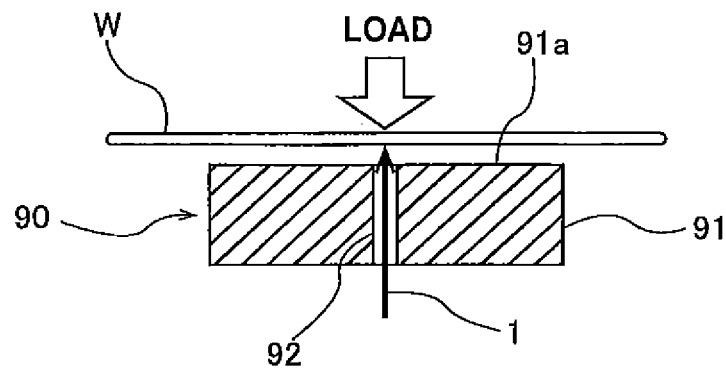
Figure 1C:
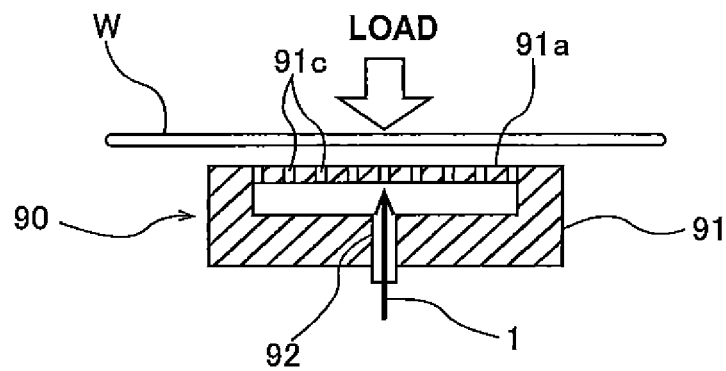

FIGS. 1A through 1C are schematic views each showing a substrate processing apparatus according to embodiments of the present invention. As shown in FIGS. 1A through 1C, a load of a processing head (not shown) is applied to a one-side surface (e.g., an upper surface) of a substrate W, and a hydrostatic support mechanism 90 is arranged so as to face the opposite surface (e.g., a lower surface) of the substrate W. The hydrostatic support mechanism 90 includes a support stage 91 having a fluid supply passage 92 defined therein for introducing a pressure fluid 1, such as a liquid or a gas.

In the example shown in FIG. 1A, the fluid supply passage 92 is coupled to a pocket (recess) 91b, formed on the support stage 91, for retaining the pressure fluid 1 therein. The load on the substrate W is received by the pressure fluid in the pocket 91b and is further received by the pressure fluid that overflows the pocket 91b onto a support surface 91a of the support stage 91.

In the example shown in FIG. 1B, the support stage 91 does not have the above-described pocket 91b. In this example, the pressure fluid 1, which has been introduced through the fluid supply passage 92, spreads over the support surface 91a in its entirety to support the load applied to the substrate W. In the example shown in FIG. 1C, the support surface 91a of the support stage 91 has a plurality of through-holes 91c defined therein. The pressure fluid 1 is supplied from the fluid supply passage 92 onto the support surface 91a in its entirety through the through-holes 91c. The hydrostatic support mechanism 90 having such structures can support the load on the substrate W through the pressure fluid 1. Even if the substrate W has on its lower surface micro LSI structures which are in the fabrication process, substrate processing can be performed with no damage to the LSI structures, because only the pressure fluid contacts the lower surface of the substrate W and no substrate holding structure directly contacts the substrate W. Examples of the pressure fluid 1 introduced through the fluid supply passage 92 include a liquid, such as water or oil, and a gas, such as high-pressure air. In the case where the substrate processing apparatus is used in the LSI fabrication process, ultrapure water or clean high-pressure air may be used as the pressure fluid 1 from the viewpoint of preventing contamination of the substrate W.

Figure 2:
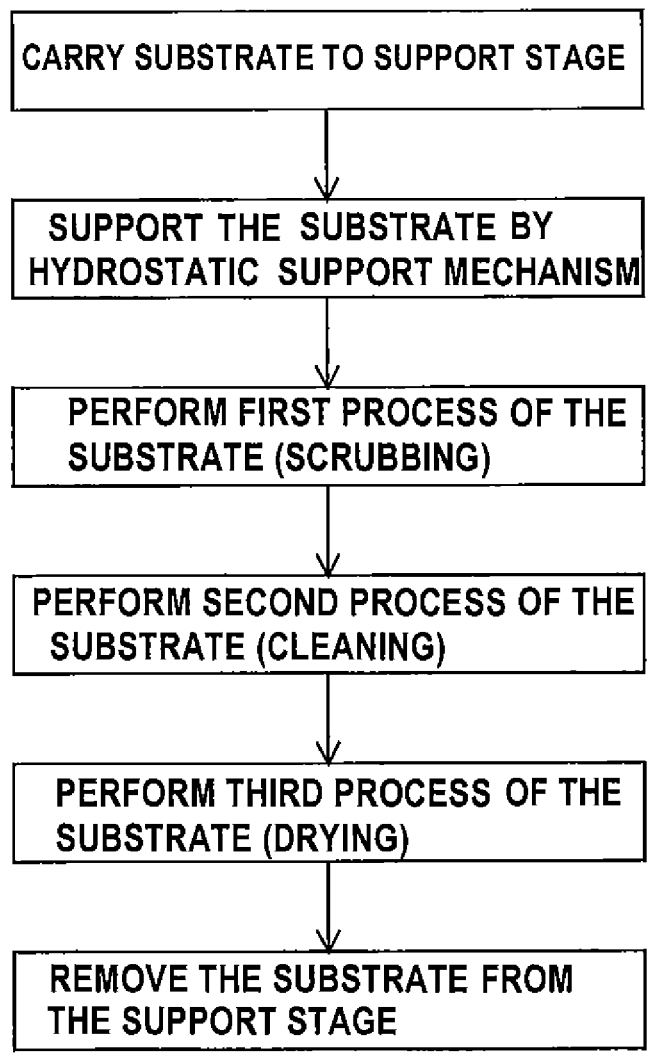
FIG. 2 is a flowchart showing a sequence of performing surface processing of a substrate using a hydrostatic support mechanism.

Surface processing of the substrate using the above-discussed hydrostatic support mechanism 90 will be described below with reference to a flowchart shown in FIG. 2. First, the substrate, to be processed, is transported to the support stage 91 by a transfer robot. If the substrate has on its one-side surface micro LSI structures which are in the process of their fabrication, it may be that the transfer robot does not touch that surface of the substrate. For example, the transfer robot holds a peripheral edge of the substrate with its hand or holds a substrate surface having no micro device structures thereon with a hand having a vacuum chuck or the like. Subsequently, the hand of the transfer robot releases the substrate on the support stage 91, so that the substrate surface, which is opposite to the surface to be processed, is supported by the hydrostatic support mechanism 90. The substrate processing apparatus may have an auxiliary holding mechanism for holding the substrate after the substrate is placed on the support stage 91 until the pressure fluid is introduced into the support stage 91. For example, a chuck configured to hold the peripheral edge of the substrate may be used as such an auxiliary holding mechanism.

Subsequently, surface processing is performed so as to remove foreign substances and scratches from the surface of the substrate. Specifically, the processing head is brought into sliding contact with the surface to be processed, and applies a load to the surface. The processing head has a substrate contact surface which may be made of a soft material, such as sponge, nonwoven fabric, foamed polyurethane, or any of these materials containing abrasive grains, or a polishing tape. The soft material to be used may be softer than a material forming the surface, to be processed, of the substrate. The material of the surface of the substrate may be silicon, silicon compound, gallium, gallium compound, metal, metal compound, or organic compound. The abrasive grains may be made of any one of silicon dioxide, silicon carbide, silicon nitride, aluminum oxide, and diamond, or may be made of a mixture of selected ones from these materials.

When the processing head is in sliding contact with the surface of the substrate to perform the above-described surface processing (i.e., removal process), a processing liquid, such as a polishing liquid or pure water, may be supplied onto the surface to be processed. The processing liquid supplied can expel from the substrate the debris (e.g., the foreign substances and film fragments removed) and reaction products produced when the surface is processed. The processing liquid may contain a component capable of dissolving a film forming the surface to be processed, abrasive grains for removing the film and the reaction products, and/or a component for preventing reattachment of the foreign substances and the reaction products once removed. The processing liquid may be neutral or alkaline or acid. The processing head may be of any size. A desired number of processing heads may be used. In order to enable the hydrostatic support mechanism 90 to reliably support the substrate, the processing head may have substantially the same size as a region where the hydrostatic support mechanism 90 can retain the fluid pressure. During surface processing of the substrate, the substrate may be rotated about its central axis.

After the surface processing, the substrate is cleaned so that the debris, such as the foreign substances and the reaction products removed, is fully expelled from the substrate. Although cleaning of the substrate may be performed using a different stage in the substrate processing apparatus, cleaning of the substrate may be performed using the same support stage 91 in order to prevent the debris from spreading around. When substrate cleaning is performed using the support stage 91, the hydrostatic support mechanism 90 is used to support the substrate surface opposite to the processed surface by the fluid pressure with no contact with the substrate in the same manner as the surface processing. The processing head is not used in this cleaning process. Instead, a cleaning liquid is supplied onto the processed surface. At the same time, additional cleaning techniques, such as two-fluid jet cleaning or megasonic cleaning, may be performed so as to clean the processed surface more efficiently than the case where only the cleaning liquid is used to rinse the processed surface. The cleaning technique to be used may be a non-contact type cleaning technique, such as the two-fluid jet cleaning, rather than a contact type cleaning technique which cleans the substrate with a cleaning tool, such as a brush or a sponge, for rubbing the processed surface. This is because the cleaning tool used in the contact type cleaning technique contacts the substrate directly and is thus likely to cause back contamination from the cleaning tool. The cleaning liquid may be pure water. In order to prevent the reattachment of the debris (e.g., the foreign substances and the reaction products removed), a surface active agent may be added to the cleaning liquid. It is also possible to use the cleaning liquid having a controlled pH for better cleaning performance.

After the substrate cleaning process, the substrate is dried. In order to prevent the debris and the mist (e.g., the cleaning liquid and the polishing liquid) from spreading out, the substrate may be dried without transporting the substrate to other stage. Various drying processes may be employed for drying the substrate. For example, the substrate may be rotated at a high speed to remove the cleaning liquid via centrifugal force, a clean gas may be supplied to the cleaned surface of the substrate to expel the cleaning liquid or droplets thereof off the substrate, or a low-vapor-pressure solvent may be supplied to the cleaned surface of the substrate so that the cleaning liquid is replaced with the low-vapor-pressure solvent, which is then evaporated to dryness. Finally, the dried substrate is unloaded from the substrate processing apparatus by the transfer robot using the hand as described above.

(1) EXAMPLE 1

Figure 3A:
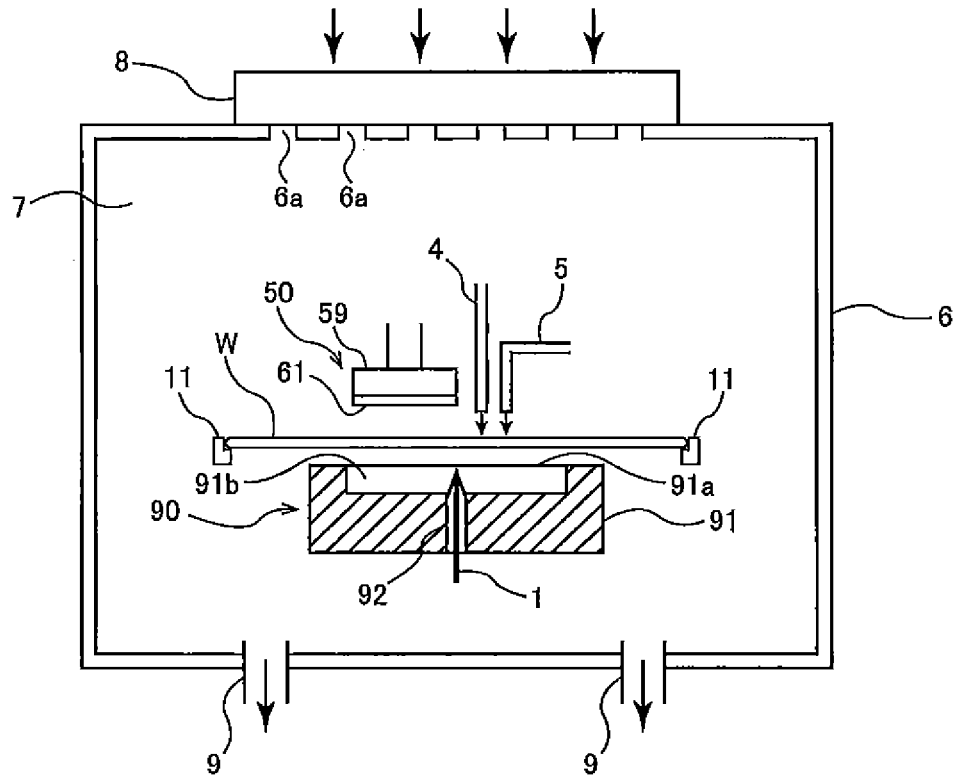
FIGS. 3A and 3B are schematic views each showing a more specific example of the substrate processing apparatus including the hydrostatic support mechanism.

More specific examples of the substrate processing apparatus including the hydrostatic support mechanism 90 will be described below with reference to FIGS. 3A and 3B. FIG. 3A is a conceptual view of the substrate processing apparatus including the hydrostatic support mechanism 90 disposed below the substrate W. The hydrostatic support mechanism 90 has the fluid supply passage 92 for the pressure fluid 1. The pressure fluid 1 is supplied to the fluid supply passage 92 through a supply pipe (not shown). Before processing of the substrate W is started, the support stage 91 of the hydrostatic support mechanism 90 is elevated toward the substrate W. After the substrate W is processed, the support stage 91 is lowered. Alternatively, the substrate processing apparatus may have a mechanism for elevating and lowering the substrate W. In FIG. 3A, the hydrostatic support mechanism 90 has the structure shown in FIG. 1A. The hydrostatic support mechanism 90 may have the structure shown in FIG. 1B or the structure shown in FIG. 1C, or another structure.

The processing head 50 is disposed so as to face the substrate surface at the opposite side of the hydrostatic support mechanism 90. The processing head 50 has a scrubbing member 61 made of a soft material, such as sponge, nonwoven fabric, foamed polyurethane, or the like. The scrubbing member 61 may be a polishing tape configured to process the surface of the substrate W. The processing head 50 further includes a holder 59 which holds the scrubbing member 61. This holder 59 may be omitted. The processing head 50 is supported by a support element (not shown) which is configured to enable the processing head 50 to rotate about its central axis, rotate about another axis, oscillate, and/or move in the vertical direction. The processing head 50 can bring the scrubbing member 61 into contact with the substrate W under a load that is transmitted to the processing head 50 through the support element. The scrubbing member 61 performs surface processing by slightly scraping off the surface of the substrate W to remove the foreign substances from the surface of the substrate W and/or by removing at least a portion of the material that forms the surface of the substrate W. This surface processing of the substrate using the scrubbing member 61 will be hereinafter referred to as "scrubbing process".

When the scrubbing process is performed on the surface of the substrate W, the processing liquid is supplied onto the surface of the substrate W through a processing liquid supply pipe 4. The processing liquid may be polishing liquid or pure water, as described above with reference to FIG. 2. Further, in order to clean the substrate W, the cleaning liquid is supplied to the substrate W through the cleaning liquid supply pipe 5. A two-fluid jet nozzle or a megasonic cleaning nozzle may be disposed on a tip end of the cleaning liquid supply pipe 5 or separately from the cleaning liquid supply pipe 5. The cleaning liquid supplied from the cleaning liquid supply pipe 5 may be pure water or a liquid containing surface active agent. It is also possible to use the cleaning liquid having a controlled pH. The cleaning liquid supply pipe 5 may supply only one type of cleaning liquid or may supply two or more types of cleaning liquids successively or simultaneously. The processing liquid supply pipe 4 and the cleaning liquid supply pipe 5 may be the same common pipe.

The substrate processing apparatus includes a plurality of chucks 11 for holding the peripheral edge of the substrate W and rotating the substrate W at a high speed so as to dry the substrate. The substrate processing apparatus may include a solvent supply pipe and/or a gas supply pipe (not shown) for supplying a low-vapor-pressure solvent and/or a gas to the substrate W. In the substrate processing apparatus shown in FIG. 3A, the scrubbing process, the cleaning process, and the drying process are performed using the same stage, while these processes may be performed using different stages. A robot may be provided for transferring the substrate between the stage or stages and a substrate loading and unloading section.

The substrate processing apparatus has a housing (a partition) 6 and an exhauster 8. The housing 6 defines a processing chamber 7 therein. An upper portion of the housing 6 has a plurality of clean air inlets 6a, and a lower portion of the housing 6 has exhaust ducts 9. The exhauster 8, which is mounted to the upper portion of the housing 6, sends clean air through the clean air inlets 6a into the processing chamber 7, forcing a gas in the processing chamber 7 out of it through the exhaust ducts 9. The above-described scrubbing process, the cleaning process, and the drying process are performed in this processing chamber 7, so that various by-products (e.g., the debris and the cleaning mist) generated in these processes are prevented from spreading out of the substrate processing apparatus. Since the substrate is cleaned and dried in the same processing chamber 7 in which the scrubbing process is performed, the substrate having its dried surface in a clean state can be removed from the substrate processing apparatus. A conventional substrate processing apparatus cannot clean and dry the processed substrate in the same chamber. For this reason the conventional apparatus cannot be installed in a clean environment, such as a clean room. In contrast, the substrate processing apparatus according to embodiments of the present invention does not permit the debris and the like to spread out of the substrate processing apparatus. Accordingly, the substrate processing apparatus can be installed in the clean room and hence can be used as an LSI circuit fabrication apparatus.

(2) EXAMPLE 2

Figure 3B:
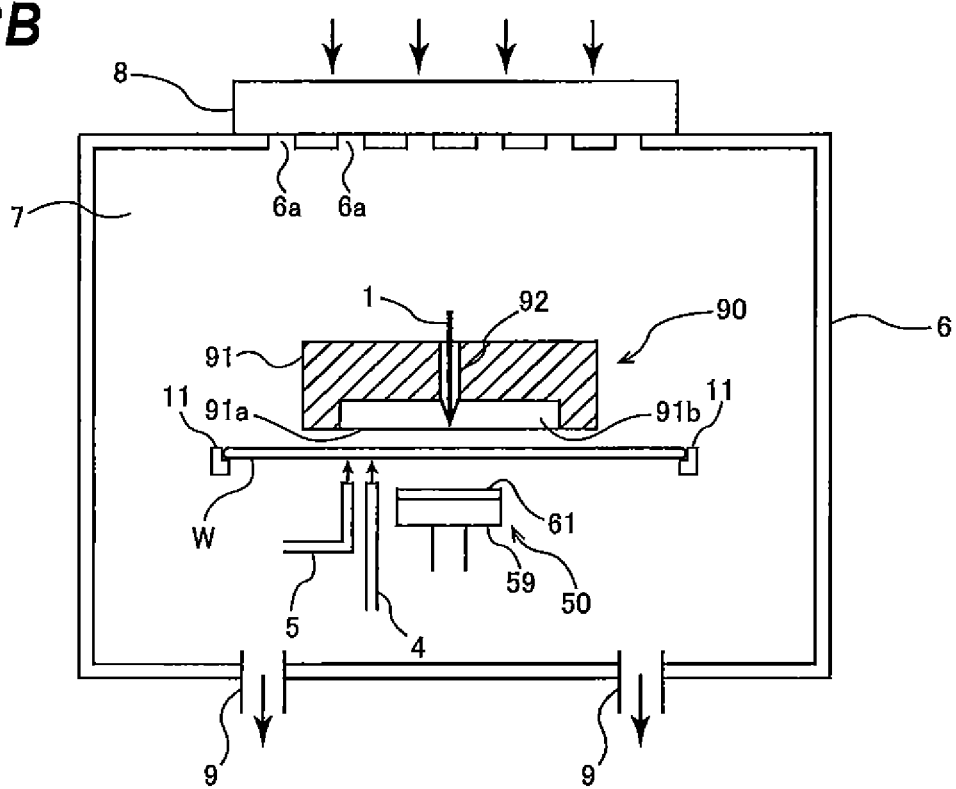

FIG. 3B is a conceptual view of the substrate processing apparatus including the hydrostatic support mechanism 90 disposed above the substrate W. The substrate processing apparatus shown in FIG. 3B has basic structures identical to those of the substrate processing apparatus shown in FIG. 3A.

(3) EXAMPLE 3

A method of performing surface processing of the substrate using the substrate processing apparatus according to an embodiment of the present invention will be described below. A substrate (e.g., a substrate in the process of LSI fabrication) is placed in the substrate processing apparatus with its one-side surface (e.g., a device surface) facing the hydrostatic support mechanism 90 and the opposite surface (e.g., the backside surface) facing the processing head 50. The peripheral edge of the substrate is held by the chucks 11. The substrate is then rotated while its device surface is supported by the hydrostatic support mechanism 90. In this state, the processing head 50 presses the backside surface, on which no device is formed, of the substrate to remove scratches and particles from the backside surface. The substrate may not be held by the chucks 11 throughout the surface processing.

When scrubbing of the substrate is performed, the backside surface of the substrate is supplied with the cleaning liquid which may be pure water, an aqueous solution containing surface active agents, or alkaline or acid cleaning liquid. The cleaning liquid may be supplied to the backside surface of the substrate when the processing head 50 is not in contact with the substrate. Since the hydrostatic support mechanism 90 faces the device surface of the substrate, a gas may be used rather than a liquid as the pressure fluid supplied from the hydrostatic support mechanism 90. This is because the liquid may cause corrosion of fine patterns which are in the process of device fabrication. In addition, when the device surface that has contacted the liquid is dried, defects such as watermarks or deformation of the fine patterns, may occur.

After the scrubbing process is terminated, the debris is removed off the substrate by the non-contact cleaning process, such as the two-fluid jet cleaning process. The two-fluid jet nozzle (not shown) used in the two-fluid jet cleaning process moves between the center and the peripheral portion of the rotating substrate while supplying a jet of fluid to the substrate surface in its entirety to clean the substrate. In this two-fluid jet cleaning process, a jet of fluid mixture of a liquid (e.g., pure water) and a high-pressure gas is supplied to the substrate. Water with a carbon dioxide gas dissolved therein or other cleaning liquid may be used instead of the pure water. The high-pressure gas may be a clean gas containing as few fine particles as possible. Any kind of gas, such as atmospheric air or nitrogen, can be used so long as there is no safety problem. A flow rate of the liquid used in the two-fluid jet cleaning process may be in a range of several mL/min to several hundreds mL/min, and a flow rate of the gas may be in a range of several tens L/min to several hundreds L/min. After the cleaning process, the chucks 11, which are holding the peripheral edge of the substrate, rotate the substrate at a high speed to thereby dry the substrate. Instead of the spin drying process or in addition to the spin drying process, the low-vapor-pressure solvent, such as isopropyl alcohol, may be supplied to the cleaned surface of the substrate so that the cleaning liquid on the substrate is replaced with the low-vapor-pressure solvent, which is then evaporated to dryness.

The substrate to be processed may be a device wafer, a glass substrate, or the like. According to the present invention, the substrate can be processed without being bent, because the substrate is supported by the fluid pressure. Therefore, substrates having various sizes can be processed. For example, wafers having diameters of 100 mm, 150 mm, 200 mm, 300 mm, and 450 mm can be processed according to the present invention. Glass substrates having large sizes can also be processed.

Figure 4:
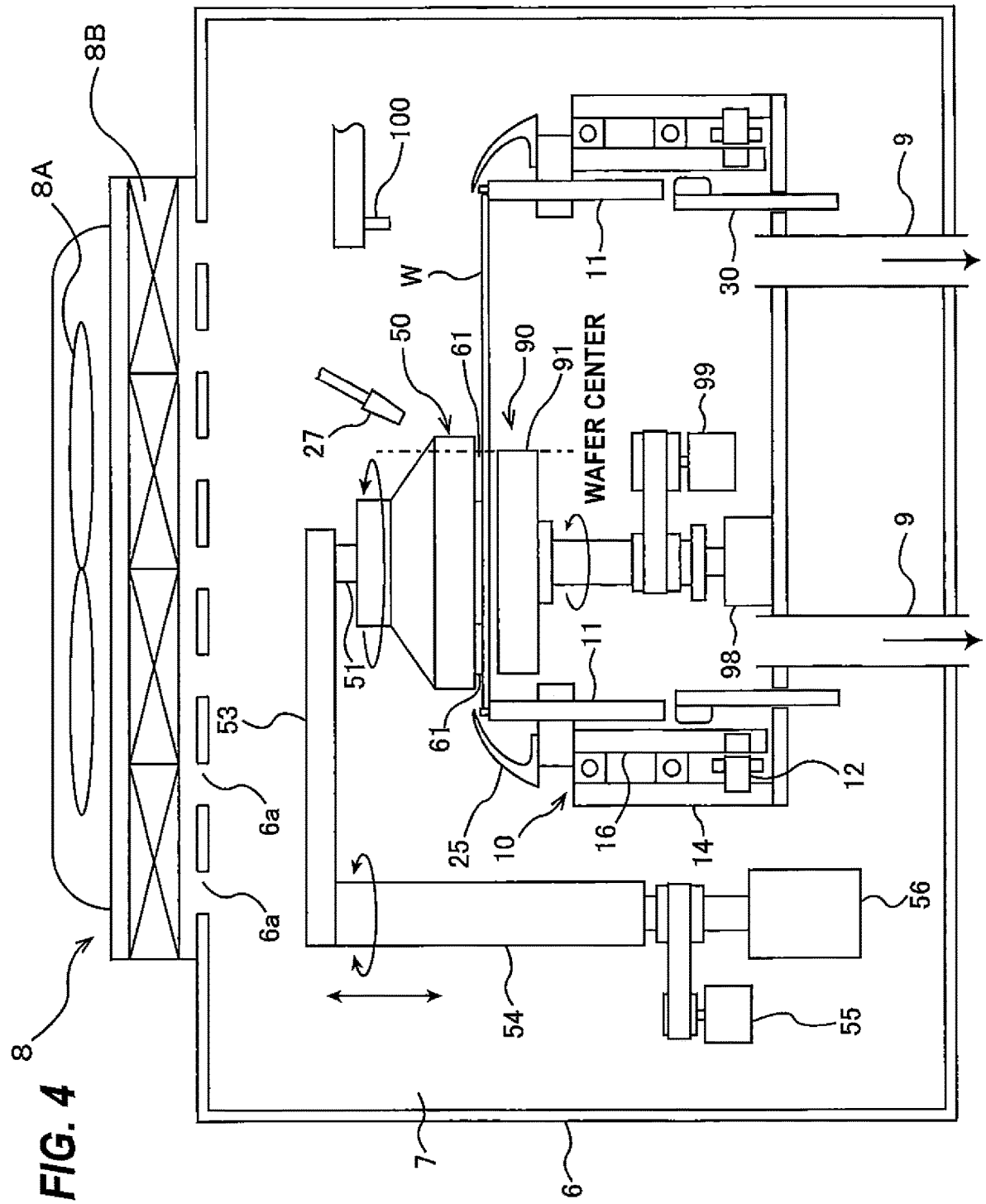
FIG. 4 is a side view of the substrate processing apparatus according to an embodiment of the present invention.

More specific examples of the substrate processing apparatus according to an embodiment of the present invention will be described below. FIG. 4 is a side view of the substrate processing apparatus according to an embodiment of the present invention. As shown in FIG. 4, the substrate processing apparatus includes: a hollow substrate rotating mechanism 10 for holding the wafer W as a substrate horizontally and rotating the wafer W about its central axis; a scrubber 50 as the processing head for scrubbing the upper surface of the wafer W, held by the substrate rotating mechanism 10, to remove the foreign substances and the scratches from the upper surface of the wafer W; and the hydrostatic support mechanism 90 for supporting the lower surface of the wafer W via the fluid pressure without contacting the substrate (i.e., in a non-contact manner).

The scrubber 50 is disposed above the wafer W held by the substrate rotating mechanism 10, and the hydrostatic support mechanism 90 is disposed below the wafer W held by the substrate rotating mechanism 10. The hydrostatic support mechanism 90 is disposed in an interior space of the substrate rotating mechanism 10. The substrate rotating mechanism 10, the scrubber 50, and the hydrostatic support mechanism 90 are enclosed by the housing 6 that forms a partition. The housing 6 defines the processing chamber 7 therein. The upper portion of the housing 6 has the multiple clean air inlets 6a defined therein, and the lower portion of the housing 6 has the exhaust ducts 9 defined therein. The exhauster 8, which is mounted to the upper portion of the housing 6, has: a fan 8A; and a filter 8B for removing particles and dust from the air delivered from the fan 8A. The exhauster 8 sends clean air through the clean air inlets 6a into the processing chamber 7, forcing a gas in the processing chamber 7 out of it through the exhaust ducts 9. The surface processing (the scrubbing process), the cleaning process, and the drying process, which will be described later in detail, are performed successively in the processing chamber 7.

The substrate rotating mechanism 10 includes: the plurality of chucks 11 for holding the peripheral edge of the wafer W and a hollow motor 12 for rotating the wafer W through the chucks 11. The substrate rotating mechanism 10 has a cylindrical shape as a whole having the large interior space defined centrally. If the substrate rotating mechanism 10 does not have such a large space underneath the wafer W, negative pressure may be produced below the wafer W when the wafer W is rotated at a high speed. Such negative pressure is likely to attract dusts and particles suspended in the air, which may be attached to the lower surface of the wafer W. In this embodiment, since the hollow motor 12 is used, the substrate rotating mechanism 10 can be of the cylindrical shape forming the large interior space below the wafer W and can therefore prevent such a problem. In addition, the hydrostatic support mechanism 90 can be disposed in the interior space of the substrate rotating mechanism 10.

Figure 5:
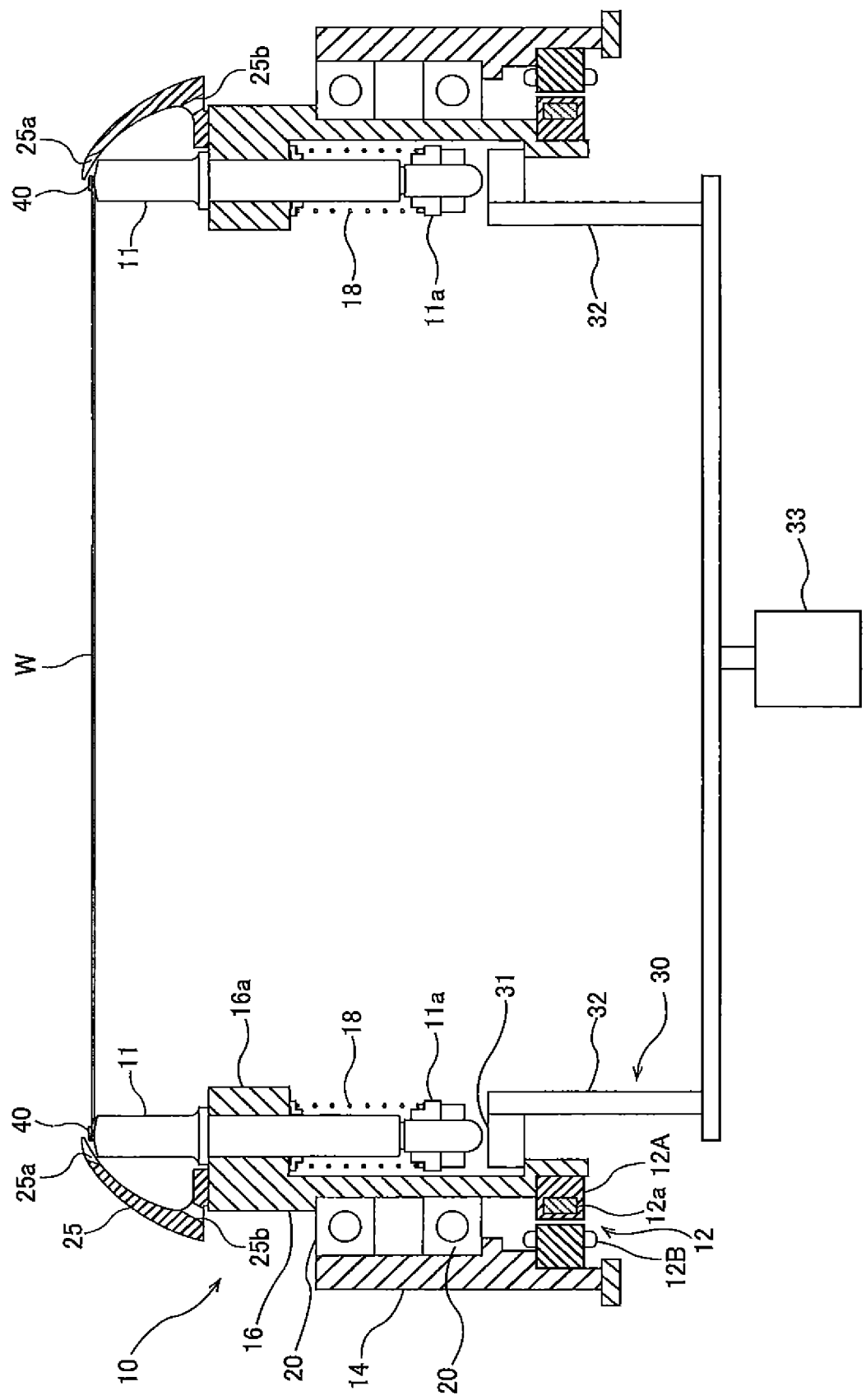
FIG. 5 is a cross-sectional view showing detailed structure of a substrate rotating mechanism.

FIG. 5 is a cross-sectional view showing a detailed structure of the substrate rotating mechanism 10. As shown in FIG. 5, the hollow motor 12 has: a cylindrical rotor 12A and a stator 12B disposed so as to surround the rotor 12A. The rotor 12A has an inner circumferential surface having a diameter larger than that of the wafer W. Use of such hollow motor 12A allows the substrate rotating mechanism 10 to have the cylindrical shape with the large interior space at the center thereof. The rotor 12A includes a plurality of permanent magnets 12a embedded therein. The hollow motor 12 is a sensorless IPM (Interior Permanent Magnet) motor with no optical position sensor. The hollow motor 12 of this type can be manufactured at low costs. Moreover, even if a liquid enters the hollow motor 12, malfunction due to failure of the position sensor is not likely to occur.

The stator 12B is fixed to a cylindrical stationary member 14. A cylindrical rotary base 16 is disposed radially inward of the stationary member 14. The rotary base 16 is rotatably supported by a combination of angular contact ball bearings 20 disposed between the stationary member 14 and the rotary base 16. These two angular contact ball bearings 20 are capable of bearing both a radial load and an axial load. Other types of bearings may be used so long as they can support both a radial load and an axial load. The stator 12B of the hollow motor 12 is secured to the stationary member 14. The rotor 12A of the hollow motor 12 is secured to the rotary base 16, so that the rotor 12A and the rotary base 16 can rotate in unison with each other.

The chucks 11 are mounted to an upper portion of the rotary base 16 such that the chucks 11 are vertically movable. More specifically, the upper portion of the rotary base 16 has an annular flange 16a projecting radially inward. The annular flange 16a has a plurality of vertical through-holes in which the chucks 11 are inserted, respectively. Springs 18 are disposed around lower portions of the chucks 11 respectively. These springs 18 have upper ends pushing the lower surface of the flange 16a upwardly and lower ends contacting spring stoppers 11a, which are mounted to respective lower ends of the chucks 11. The chucks 11 are forced downward by the respective springs 18. The chucks 11 are rotatable in unison with the rotary base 16 by the hollow motor 12.

Figure 6:
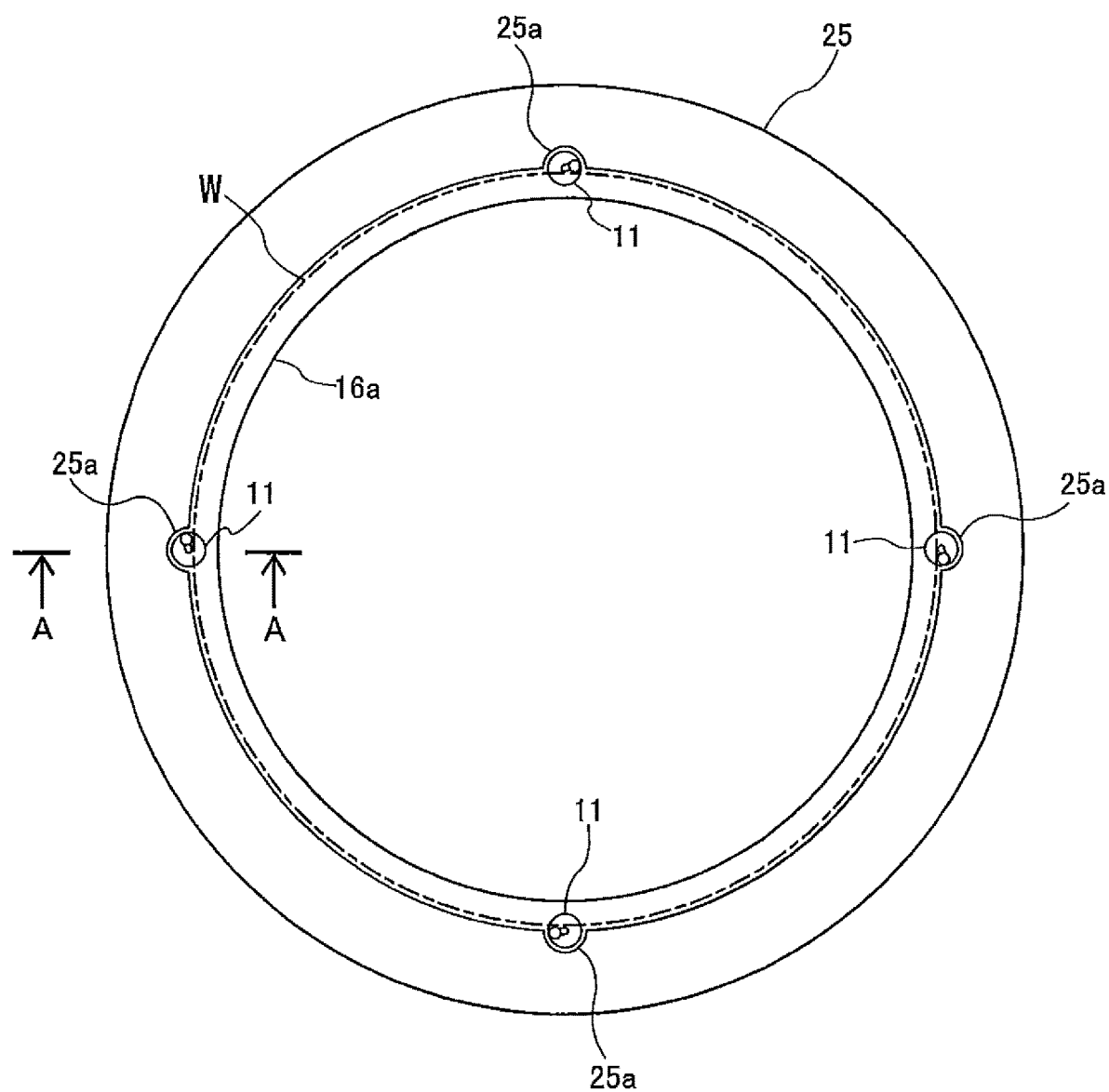
FIG. 6 is a plan view of a spin cover and a plurality of chucks.

An annular spin cover (or spin cup) 25 is disposed radially outwardly of the chucks 11 so as to surround the wafer W held by the chucks 11. The spin cover 25 is secured to an upper surface of the rotary base 16, so that the spin cover 25 can rotate in unison with the wafer W. FIG. 6 is a plan view of the spin cover 25 and the chucks 11. As shown in FIG. 6, the spin cover 25 is shaped so as to surround the circumference of the wafer W in its entirety. The spin cover 25 has an upper end whose inside diameter is slightly larger than the diameter of the wafer W. The upper end of the spin cover 25 has a plurality of cutout portions 25a at positions corresponding to those of the chucks 11. Each cutout portion 25a is shaped so as to extend along the circumferential surface of each chuck 11.

As shown in FIG. 5, the spin cover 25 has an inner circumferential surface having a vertical cross-sectional shape inclined radially inward and defined by a smooth curved line. The upper end of the spin cover 25 is located close to the wafer W. The spin cover 25 has oblique liquid drain holes 25b defined in a lower portion thereof.

As shown in FIG. 4, a cleaning liquid supply nozzle 27 for supplying pure water as the cleaning liquid onto the upper surface of the wafer W is disposed above the wafer W. The cleaning liquid supply nozzle 27 is coupled to a cleaning liquid source (not shown), so that the pure water is supplied onto the upper surface of the wafer W through the cleaning liquid supply nozzle 27. When the wafer W is rotated about its own axis by the substrate rotating mechanism 10, the pure water, supplied to the wafer W, is expelled off the wafer W under centrifugal force. Further, the pure water is trapped by the inner circumferential surface of the spin cover 25 and flows into the liquid drain holes 25b.

Figure 7:
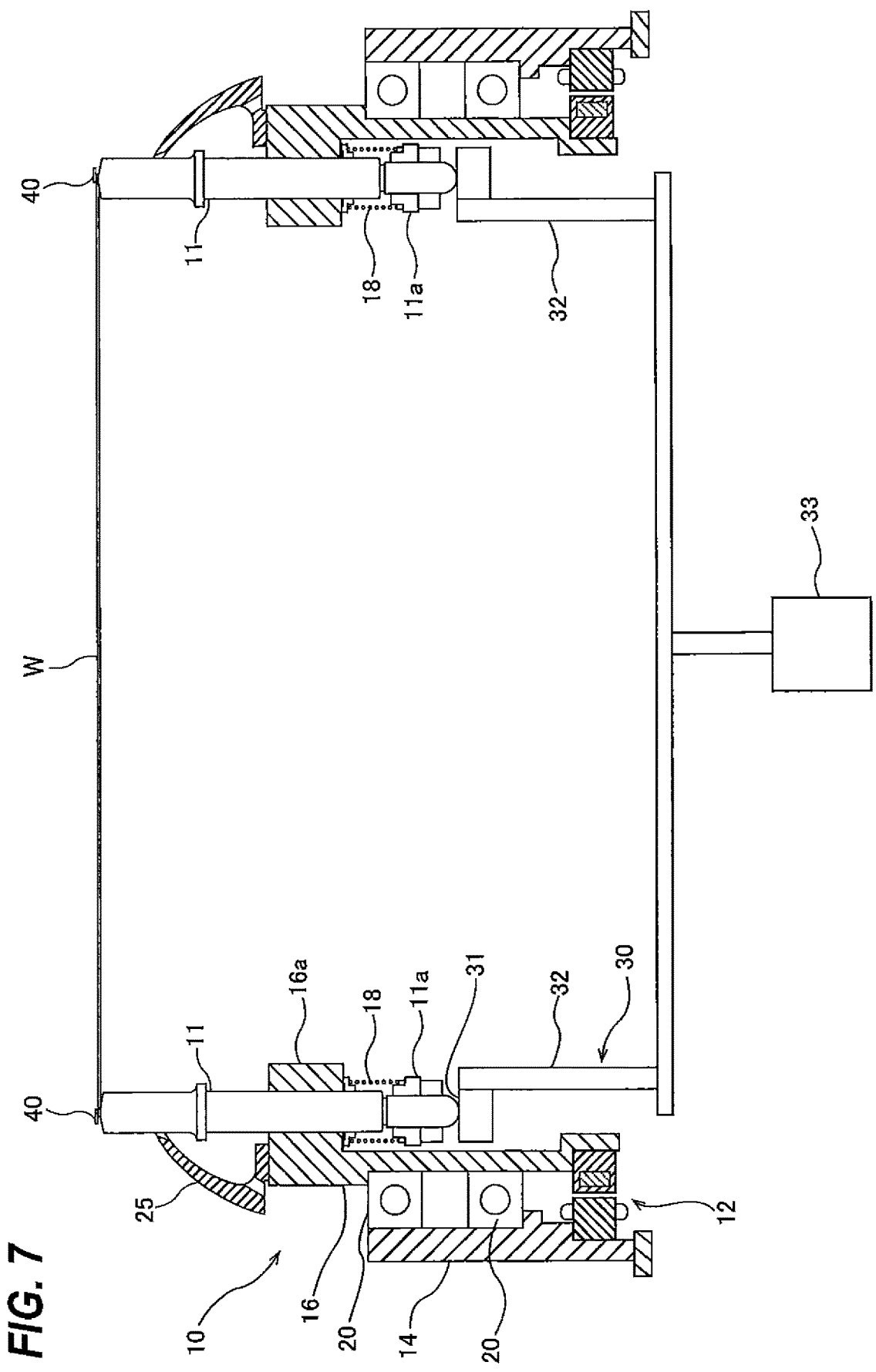
FIG. 7 is a cross-sectional view of the substrate rotating mechanism with a wafer in an elevated position.

A lift mechanism 30 for elevating the chucks 11 is disposed below the chucks 11. The lift mechanism 30 includes: a ring stage 31 disposed below the chucks 11; a plurality of rods 32 supporting the ring stage 31; and an air cylinder 33 as an actuator for elevating the rods 32. The lift mechanism 30, which is separated from the rotary base 16, is not rotatable. As shown in FIG. 7, the air cylinder 33 is configured to elevate the ring stage 31 through the rods 32. The upward movement of the ring stage 31 moves the chucks 11 upwardly simultaneously. When the operation of the air cylinder 33 is stopped, the chucks 11 are lowered by the springs 18 mounted to the chucks 11. FIG. 5 shows a state in which the chucks 11 are in a lowered position. The lift mechanism 30 and the springs 18 constitute a vertically moving mechanism for vertically moving the chucks 11.

Although not shown, instead of the air cylinders 33, a plurality of electric cylinders capable of elevating the respective chucks 11 simultaneously may be provided. For example, four electric cylinders are provided for the four chucks 11, respectively. In the case of using the electric cylinders, the ring stage 31 is not provided. When the rotation of the wafer W stops, the chucks 11 are controlled so as to stop at positions above the respective electric cylinders. Operations of the electric cylinders are controlled by a common driver so that the electric cylinders operate in synchronism.

Clamps 40 for holding the peripheral edge of the wafer W are mounted respectively to the upper ends of the chucks 11. When the chucks 11 are in the lowered position shown in FIG. 5, the clamps 40 are in contact with the peripheral edge of the wafer W to thereby hold the peripheral edge. When the chucks 11 are in the elevated position shown in FIG. 7, the clamps 40 are separated from the peripheral edge of the wafer W to release the peripheral edge.

As shown in FIG. 4, the scrubber 50 is disposed at the upper side of the wafer W. The scrubber 50 is coupled to one end of a swing arm 53 through a scrubber shaft 51. The other end of the swing arm 53 is fixed to a pivot shaft 54, which is coupled to a shaft rotating mechanism 55. This shaft rotating mechanism 55 is configured to rotate the pivot shaft 54 such that the scrubber 50 moves between a processing position shown in FIG. 4 and a retreat position located radially outwardly of the wafer W. The pivot shaft 54 is further coupled to a scrubber elevating mechanism 56 which moves the scrubber 50 vertically. This scrubber elevating mechanism 56 is configured to elevate and lower the scrubber 50 through the pivot shaft 54 and the scrubber shaft 51. The scrubber 50 is lowered to contact the upper surface of the wafer W by the scrubber elevating mechanism 56. The scrubber elevating mechanism 56 may include an air cylinder or a combination of a servomotor and a ball screw.

Figure 8:
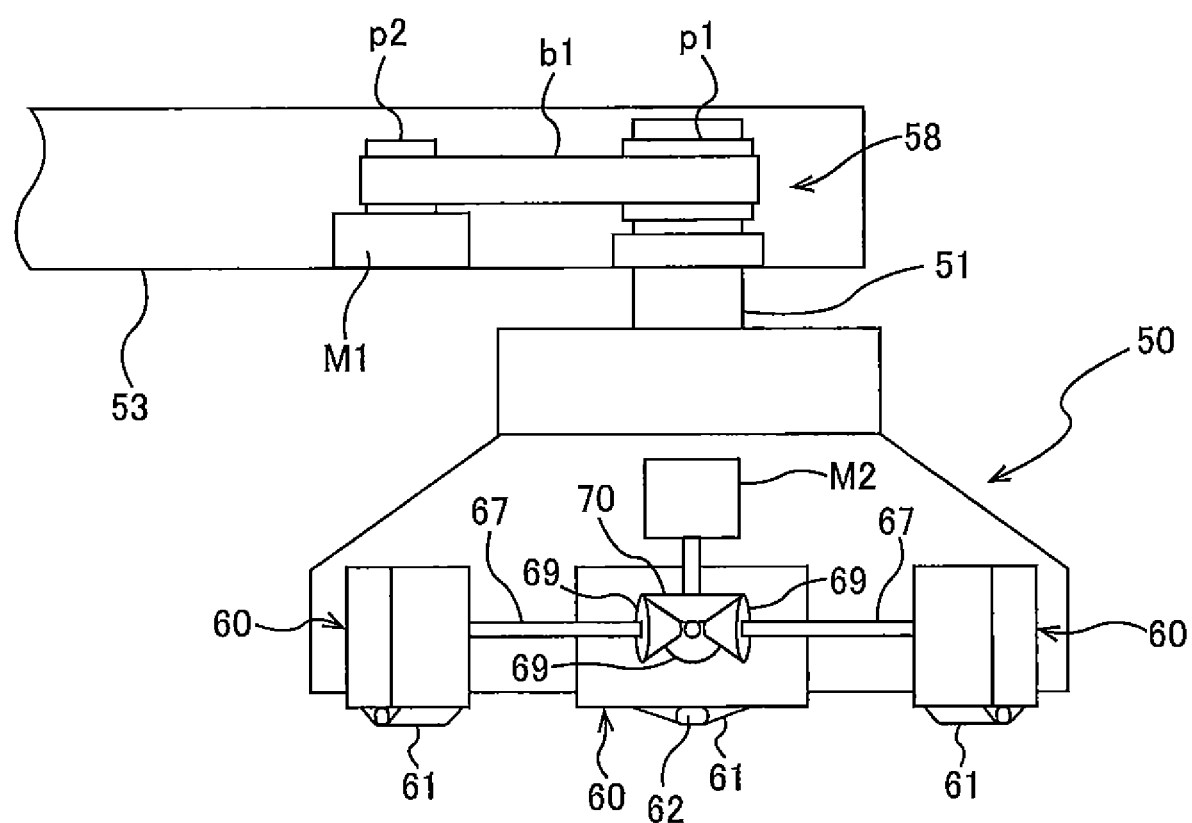
FIG. 8 is a view showing internal structures of a scrubber and a swing arm.

FIG. 8 is a view showing internal structures of the scrubber 50 and the swing arm 53. As shown in FIG. 8, a scrubber rotating mechanism 58 is provided in the swing arm 53. This scrubber rotating mechanism 58 is configured to rotate the scrubber 50 about its central axis. More specifically, the scrubber rotating mechanism 58 includes: a pulley p1 fixed coaxially to the scrubber shaft 51; a motor M1 mounted to the swing arm 53; a pulley p2 fixed coaxially to a rotational shaft of the motor M1; and a belt b1 riding on the pulleys p1 and p2. Rotation of the motor M1 is transmitted through the pulleys p1 and p2 and the belt b1 to the scrubber shaft 51, which rotates the scrubber 50.

Figure 9:
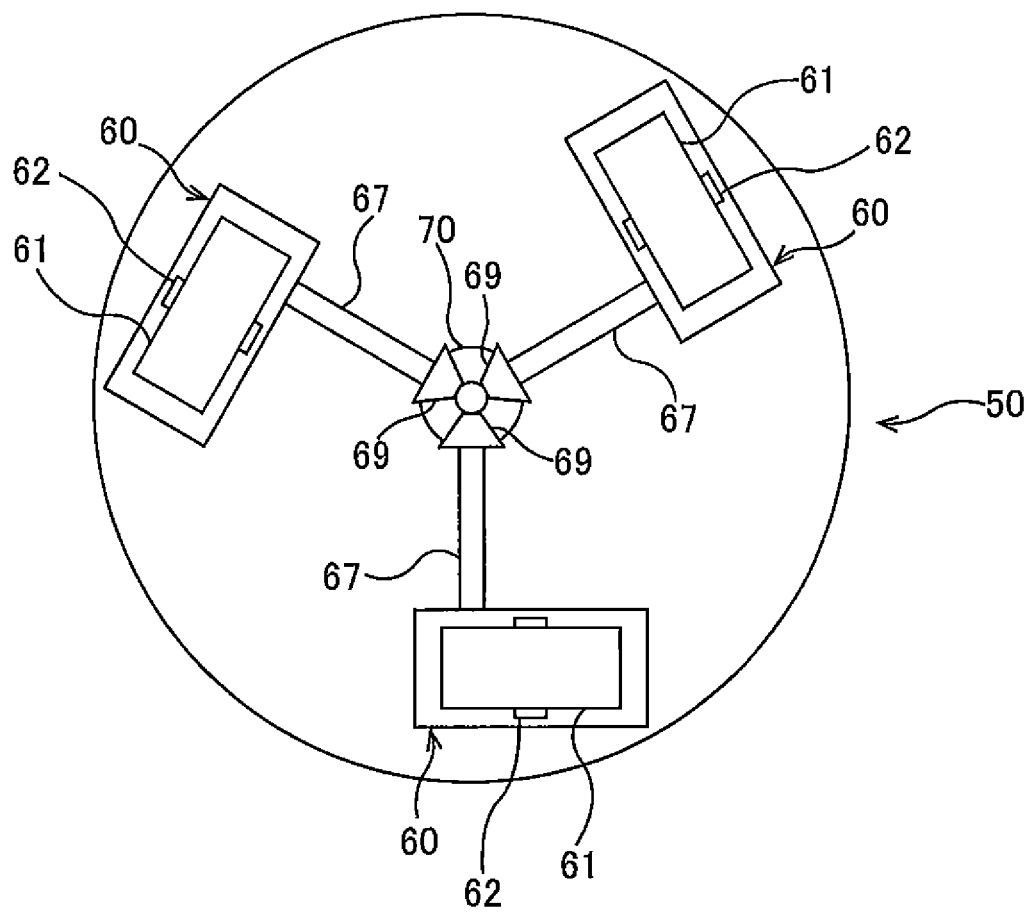
FIG. 9 is a bottom view of the scrubber.

FIG. 9 is a bottom view of the scrubber 50. The scrubber 50 has a lower surface that provides a circular scrubbing surface for scrubbing the upper surface of the wafer W (the front-side surface or the backside surface of the wafer W) that is held by the substrate rotating mechanism 10. The scrubber 50 has a plurality of (three in FIG. 9) cleaning tapes 61 as scrubbing members arranged so as to face the upper surface of the wafer W. The scrubber 50 has a plurality of (three in FIG. 9) tape cartridges 60 accommodating the cleaning tapes 61 therein, respectively. The tape cartridges 60 are removably installed in the scrubber 50.

When scrubbing the wafer W, the scrubber 50 is rotated about its central axis by the scrubber rotating mechanism 58 to rotate the cleaning tapes 61 about the central axis of the scrubber 50, so that the cleaning tapes 61 are placed in sliding contact with the upper surface of the wafer W. The scrubbing surface of the scrubber 50 is formed by the rotating cleaning tapes 61. Since the lower surface of the wafer W is supported by the fluid pressure, the scrubber 50 can press the cleaning tapes 61 against the upper surface of the wafer W with a large load without bending the wafer W. Material forming the upper surface of the wafer W is scraped off slightly by the sliding contact with the cleaning tapes 61. Therefore, the foreign substances attached to the wafer W and the surface scratches of the wafer W can be removed. An amount (or a thickness) of the material scraped off the wafer W by the scrubber 50 may be 50 nm or less. The surface of the wafer W that has been scrubbed may have a surface roughness of 5 μm or less. In this manner, by slightly scrapping away the surface of the wafer W, the foreign substances stuck firmly into the wafer W and having a diameter of 100 nm or greater can be completely removed from the wafer W.

Figure 10:
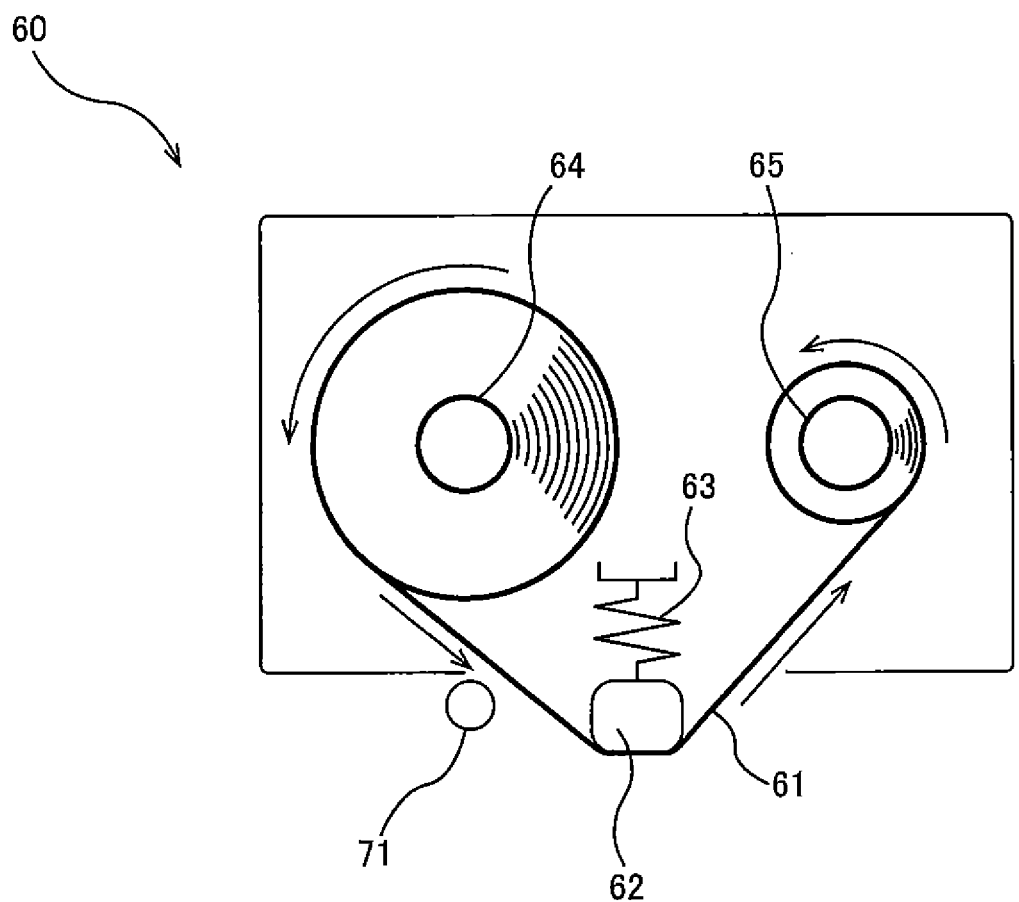
FIG. 10 is a cross-sectional view of a tape cartridge.

FIG. 10 is a cross-sectional view of the tape cartridge 60. As shown in FIG. 10, the tape cartridge 60 includes: the cleaning tape 61; a press member 62 for pressing the cleaning tape 61 against the wafer W; a biasing device 63 for biasing the press member 62 toward the wafer W; a tape feeding reel 64 for feeding the cleaning tape 61; and a tape winding reel 65 for winding the cleaning tape 61 that has been used in the scrubbing process. The cleaning tape 61 advances from the tape feeding reel 64 to the tape winding reel 65 via the press member 62. The press members 62 of the respective tape cartridges 60 extend in the radial direction of the scrubber 50 and are arranged at equal intervals in a circumferential direction of the scrubber 50. Therefore, the cleaning tapes 61 have respective wafer contact surfaces (i.e., substrate contact surfaces) extending in the radial direction of the scrubber 50. In FIG. 10, a spring is used as the biasing device 63.

The tape winding reels 65 of the tape cartridges 60 are coupled to one ends of tape winding shafts 67 as shown in FIGS. 8 and 9. Bevel gears 69 are secured to the other ends of the tape winding shafts 67, respectively. These bevel gears 69, which are coupled to the tape cartridges 60, are in mesh with a bevel gear 70 which is coupled to a rotational shaft of a motor M2 arranged in the scrubber 50. With these configurations, the tape winding reels 65 are driven by the motor M2 to wind the cleaning tapes 61. The motor M2, the bevel gears 69 and 70, and the tape winding shafts 67 jointly construct a tape advancing mechanism for advancing the cleaning tapes 61 from the tape feeding reels 64 to the tape winding reels 65.

Each cleaning tape 61 has a width ranging from 10 mm to 60 mm and a length ranging from 20 m to 100 m. The cleaning tape 61 may be made of nonwoven fabric, woven fabric, or knitted fabric. Nonwoven fabric harder than PVA sponge may be used as the cleaning tape 61. The cleaning tape 61 made of such nonwoven fabric can remove the foreign substances on the wafer W, particularly the foreign substances stuck into the surface of the wafer W. Instead of the cleaning tape 61, a polishing tape having on its one-side surface a polishing layer containing abrasive grains may be used as the scrubbing member.

When the wafer W is scrubbed, the cleaning tape 61 is advanced at a predetermined speed from the tape feeding reel 64 to the tape winding reel 65. Therefore, a new (i.e., unused) surface of the cleaning tape 61 is brought into contact with the wafer W at all times. Each cleaning tape 61 has an end mark (not shown) near the terminal end thereof. This end mark is detected by an end-mark detection sensor 71 which is disposed in proximity to the cleaning tape 61. When the end-mark detection sensor 71 detects the end mark on the cleaning tape 61, the end-mark detection sensor 71 sends a detection signal to an operation controller (not shown). Upon receiving the detection signal, the operation controller produces a signal, such as a warning signal, for prompting a user to replace the cleaning tape 61 with new one. Since the tape cartridges 60 are removable, they can easily be replaced with new tape cartridges 60.

The retreat position of the scrubber 50 is located radially outwardly of the wafer W and the scrubber 50 is configured to be movable between the retreat position and the processing position. A bath (not shown) retaining pure water therein is provided in the retreat position. When the scrubber 50 is in the retreat position, the lower surface (i.e., the scrubbing surface) of the scrubber 50 is immersed into the pure water in the bath in order to prevent the cleaning tapes 61 from being dried. The pure water in the bath is replaced with fresh pure water each time the scrubber 50 performs surface processing of the wafer W, so that the bath contains clean pure water at all times.

Figure 11:
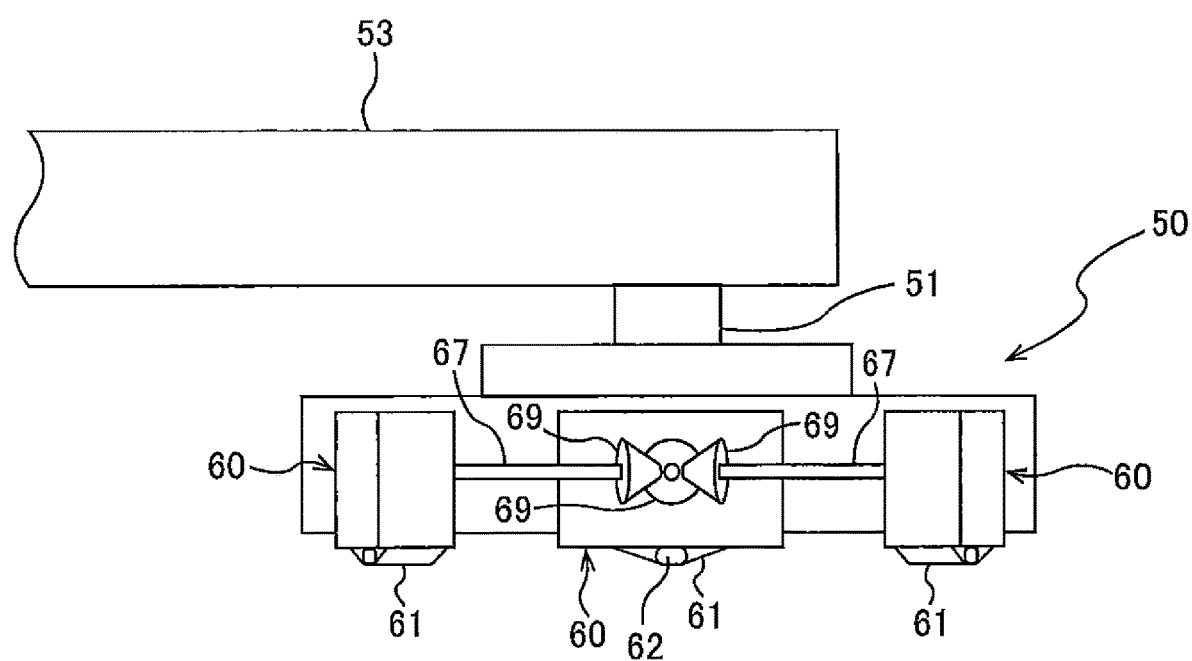
FIG. 11 is a view showing another example of the scrubber.
Figure 12:
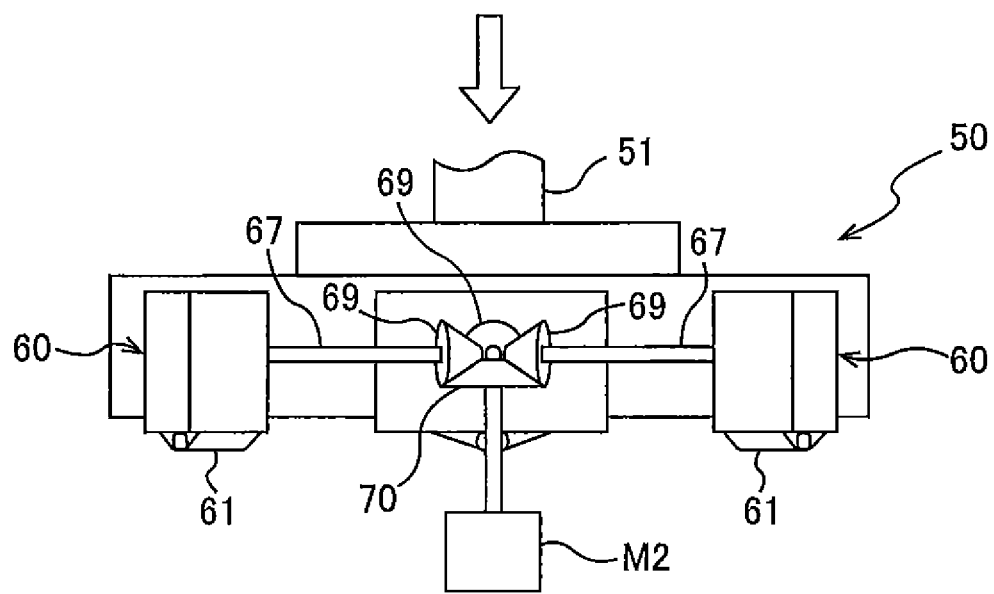
FIG. 12 is a view showing the manner in which cleaning tapes are wound when the scrubber is in a retreat position.
Figure 13:
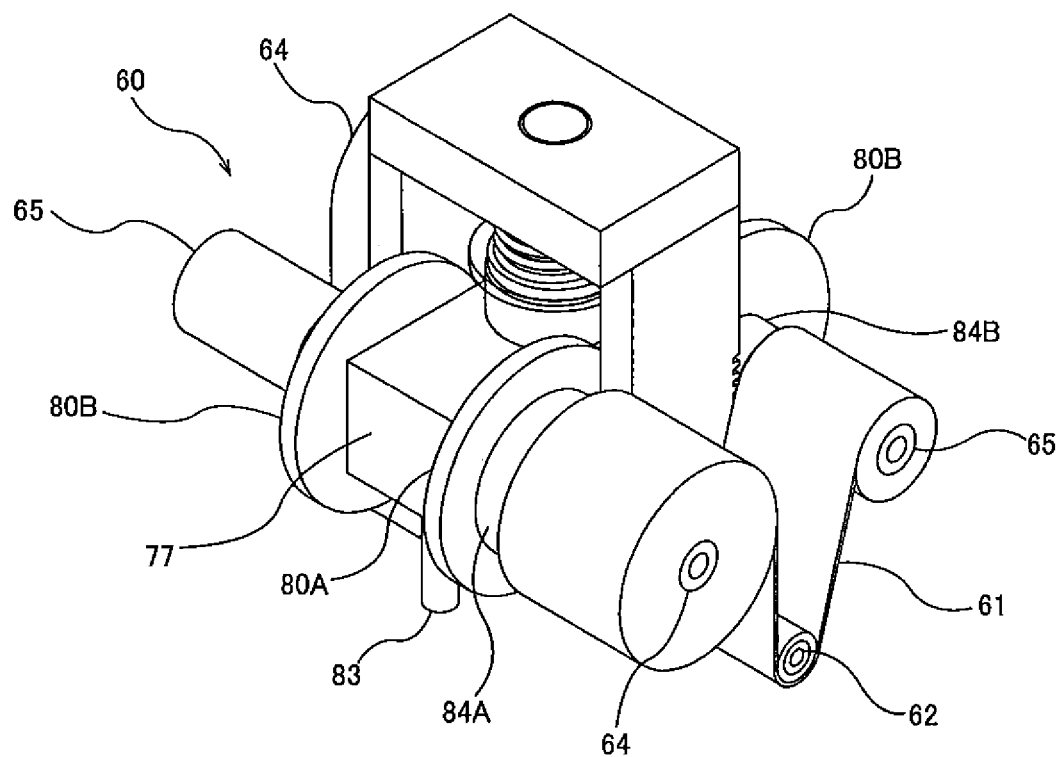
FIG. 13 is a perspective view of another example of the tape cartridge.
Figure 14:
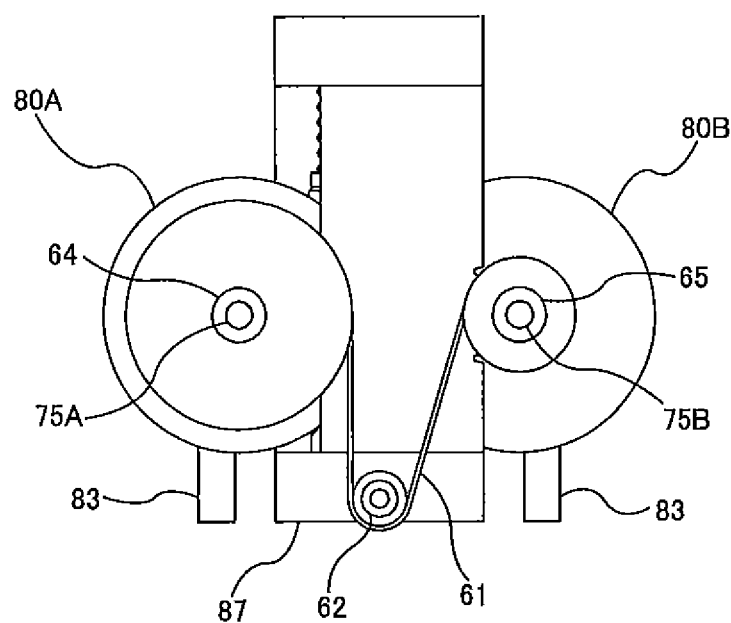
FIG. 14 is a side view of the tape cartridge shown in FIG. 13.
Figure 15:
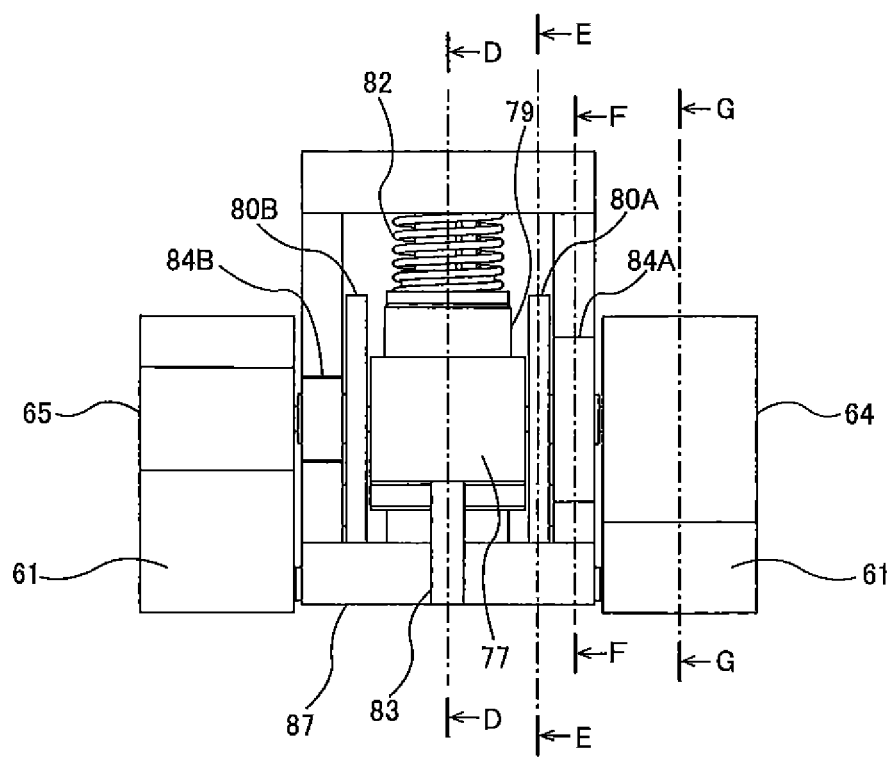
FIG. 15 is a front view of the tape cartridge shown in FIG. 13.
Figure 16:
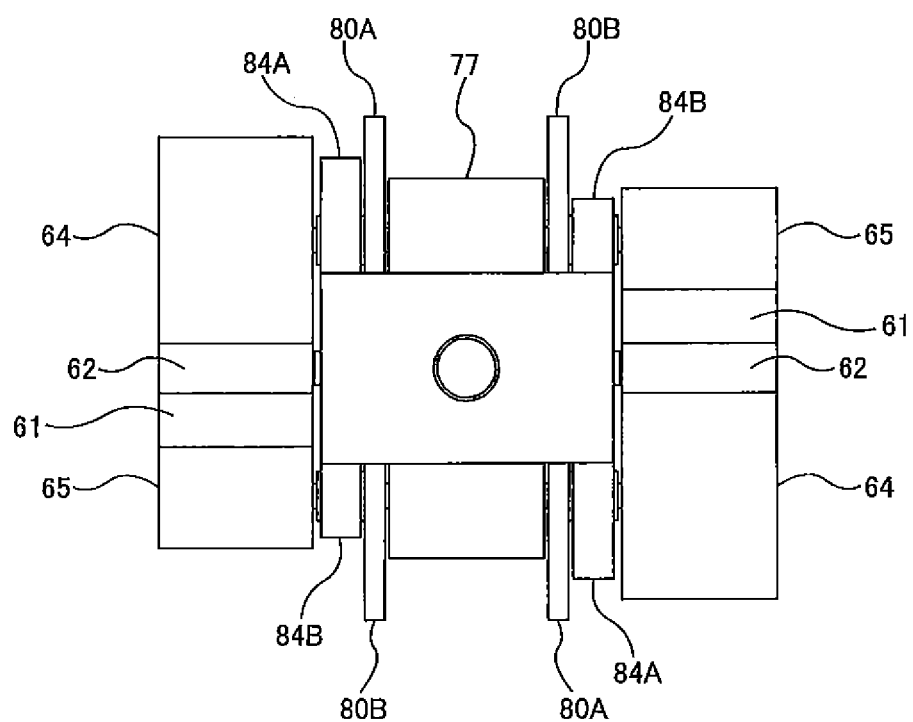
FIG. 16 is a plan view of the tape cartridge shown in FIG. 13.
Figure 17:
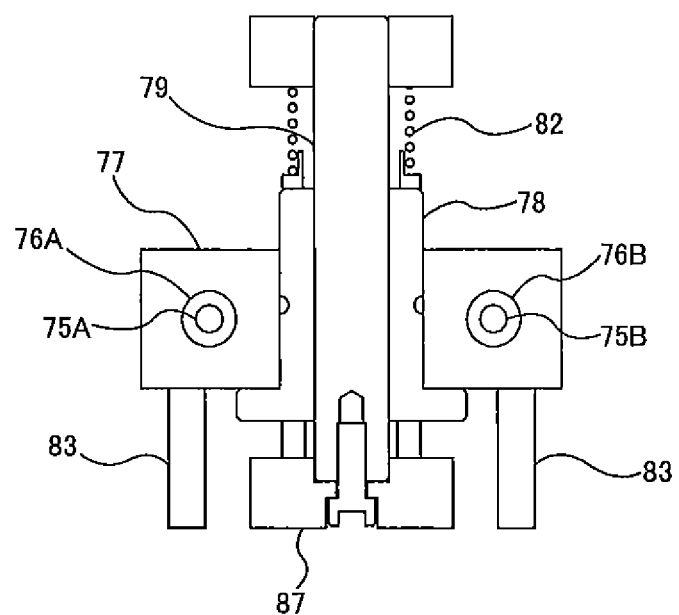
FIG. 17 is a cross-sectional view taken along line D-D in FIG. 15.
Figure 18:
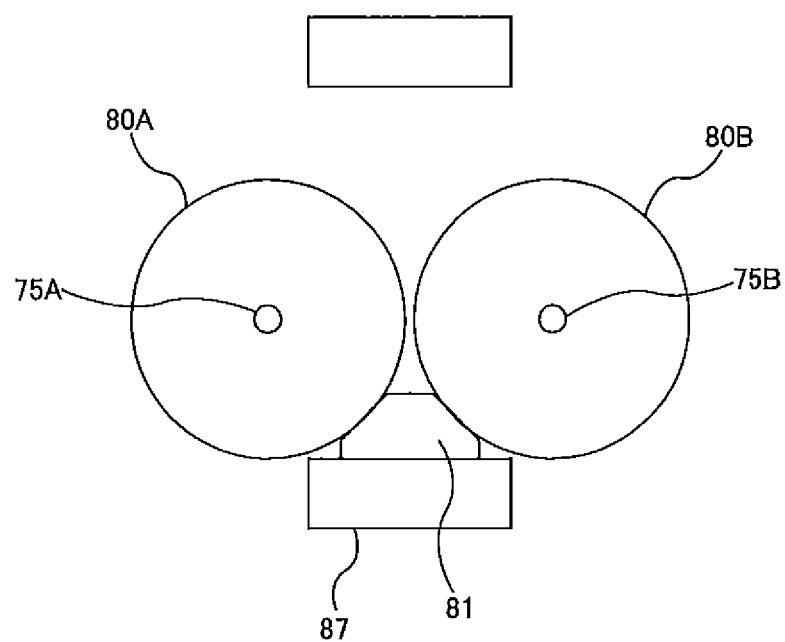
FIG. 18 is a cross-sectional view taken along line E-E in FIG. 15.

FIG. 11 is a view showing another example of the scrubber 50. The scrubber 50 shown in FIG. 11 does not include the motor M2 therein for advancing the cleaning tapes 61. Instead, as shown in FIG. 12, the motor M2 and the bevel gear 70 are provided in the retreat position. When the scrubber 50 is lowered in the retreat position, the bevel gears 69 are brought into mesh with the bevel gear 70. In this state, the motor M2 is actuated to advance the cleaning tapes 61 by a predetermined distance from the tape feeding reels 64 to the tape winding reels 65. According to this example shown in FIG. 11, the structure of the scrubber 50 can be simple, and consumption of the cleaning tapes 61 can be reduced because the cleaning tapes 61 are advanced intermittently.

FIGS. 13 through 20 show another example of the tape cartridge 60. In this example also, the scrubber 50 does not include the motor M2 therein for advancing the cleaning tapes 61. The tape feeding reel 64 and the tape winding reel 65 are mounted respectively to reel shafts 75A and 75B, which are rotatably supported by respective bearings 76A and 76B secured to a reel housing 77. This reel housing 77 is secured to a ball spline nut 78. The reel housing 77 and the ball spline nut 78 are vertically movable relative to a spline shaft 79.

Brake wheels 80A and 80B are fixed to the reel shafts 75A and 75B, respectively. The tape feeding reel 64 and the brake wheels 80A are rotatable in unison with each other, and the tape winding reel 65 and the brake wheels 80B are rotatable in unison with each other. The ball spline nut 78 is forced downward by a spring 82, so that the brake wheels 80A and 80B are pressed against a brake pad 81 by the spring 82. When the brake pad 81 is in contact with the brake wheels 80A and 80B, the brake wheels 80A and 80B and the tape feeding reel 64 and the tape winding reel 65 coupled thereto are unable to rotate freely. Downwardly extending pins 83 are fixed to the reel housing 77. These pins 83 are brought into contact with pin stoppers (not shown) which are provided in the retreat position of the scrubber 50.

Figure 19:
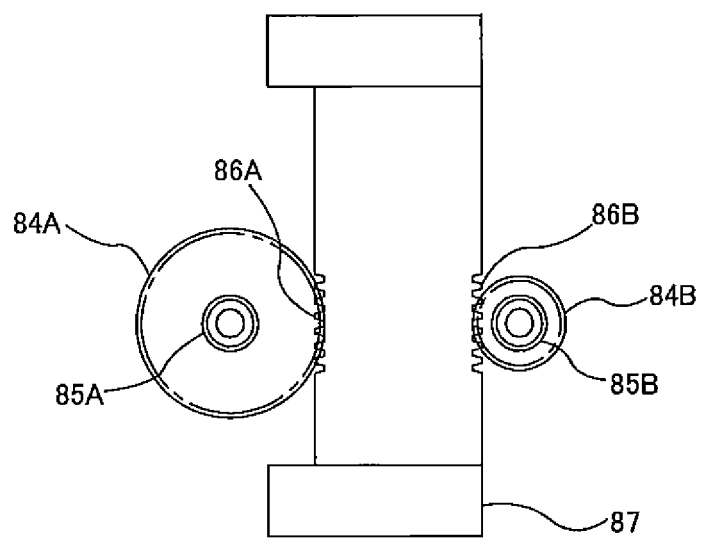
FIG. 19 is a cross-sectional view taken along line F-F in FIG. 15.

A tape feeding gear 84A is mounted to the reel shaft 75A, and a tape winding gear 84B is mounted to the reel shaft 75B, as shown in FIG. 19. The tape feeding gear 84A has a larger diameter than that of the tape winding gear 84B. The tape feeding gear 84A and the tape winding gear 84B are attached respectively to the reel shafts 74A and 75B through one-way clutches 85A and 85B. The tape feeding reel 64, the tape winding reel 65, the brake wheels 80A and 80B, the tape feeding gear 84A, and the tape winding gear 84B are vertically movable in unison relative to the spline shaft 79. Rack gears 86A and 86B are disposed between the tape feeding gear 84A and the tape winding gear 84B. The tape feeding gear 84A is in mesh with the rack gear 86A, while the tape winding gear 84B is in mesh the rack gear 86B. The press member 62, the brake pad 81, and the rack gears 86A and 86B are secured to an installation base 87.

When the scrubber 50 is lowered in the retreat position, the pins 83 are brought into contact with the pin stoppers. At this time, the downward movements of the tape feeding reel 64, the tape winding reel 65, the brake wheels 80A and 80B, the tape feeding gear 84A, and the tape winding gear 84B, all of which are coupled to the pins 83, are stopped, while the press member 62, the brake pad 81, and the rack gears 86A and 86B continue to move downwardly. As a result, the spring 82 is compressed, and the brake pad 81 is separated from the brake wheels 80A and 80B, allowing the tape feeding reel 64 and the tape winding reel 65 to rotate freely. As the rack gears 86A and 86B are lowered, the tape feeding gear 84A and the tape winding gear 84B, which are in engagement with the rack gears 86A and 86B, rotate. The tape feeding reel 64 rotates together with the tape feeding gear 84A to thereby unreel or feed a new portion of the cleaning tape 61 by a predetermined length. On the contrary, the tape winding reel 65 does not rotate because of the one-way clutch 85B.

Figure 20:
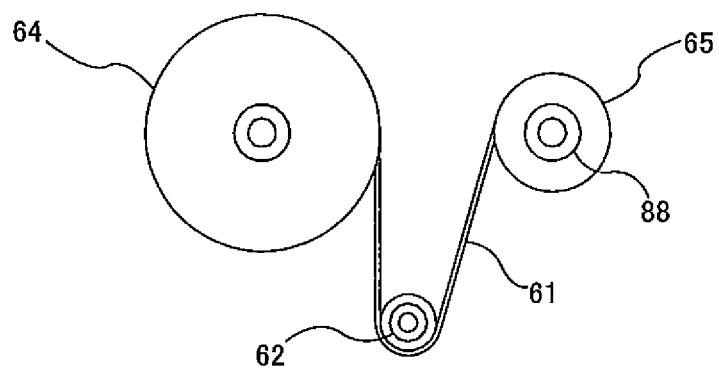
FIG. 20 is a cross-sectional view taken along line G-G in FIG. 15.

As the scrubber 50 is elevated, the spring 82 extends, and the rack gears 86A and 86B move upwardly to rotate the tape feeding gear 84A and the tape winding gear 84B. The tape winding reel 65 rotates together with the tape winding gear 84B to wind the used cleaning tape 61, while the tape feeding reel 64 does not rotate because of the one-way clutch 85A. Since the tape winding gear 84B has a smaller diameter than that of the tape feeding gear 84A, the tape winding reel 65 makes more revolutions than the tape feeding reel 64 does. As shown in FIG. 20, a toque limiter 88 is incorporated in the tape winding reel 65. This toque limiter 88 is configured to permit the tape winding gear 84B to slip after the tape winding reel 65 has wound the cleaning tape 61 to thereby apply a tension to the cleaning tape 61. When the brake pad 81 contacts the brake wheels 80A and 80B, the tape winding reel 65 stops rotating, whereby the renewal of the cleaning tape 61 is terminated.

Since the tape cartridge 60 shown in FIGS. 13 through 20 requires no motor for advancing the cleaning tape 61, the structure of the scrubber 50 can be made simple. Furthermore, because the cleaning tape 61 is advanced intermittently, the consumption of the cleaning tape 61 can be reduced. As can be seen from in FIGS. 15 and 16, the tape cartridge 60 in this example has a symmetric structure, and each tape cartridge 60 has two cleaning tapes 61.

Figure 21:
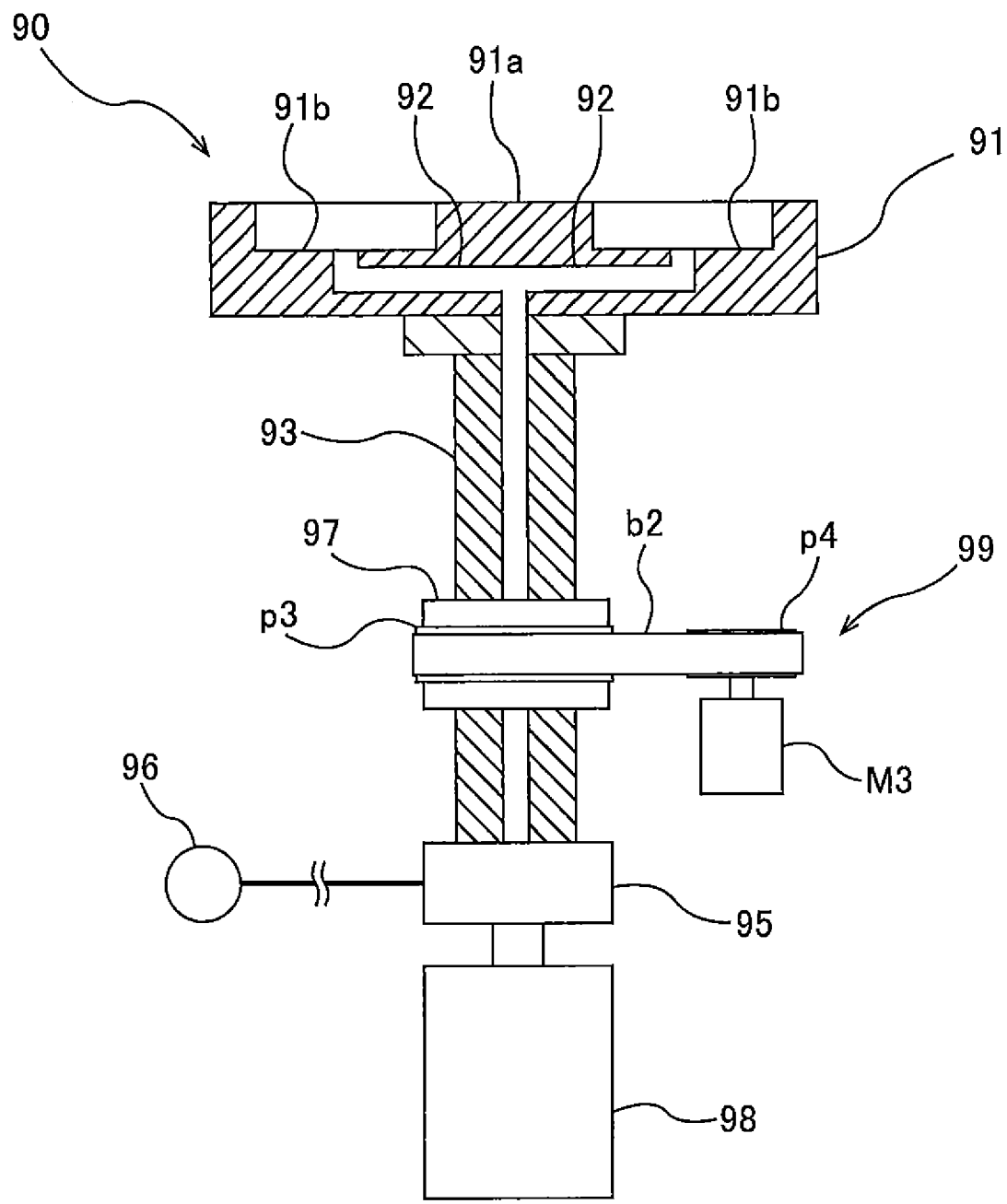
FIG. 21 is a cross-sectional view of the hydrostatic support mechanism.

FIG. 21 is a cross-sectional view of the hydrostatic support mechanism 90. As shown in FIG. 21, the hydrostatic support mechanism 90 includes: the support stage 91 having the circular substrate support surface 91a with a plurality of recesses 91b as fluid reservoirs defined thereon; a plurality of fluid supply passages 92 coupled to the respective recesses 91b; and a support shaft 93 supporting the support stage 91. The fluid supply passages 92 extend through the support shaft 93 and are coupled to a fluid source 96 through a rotary joint 95.

Figure 22:
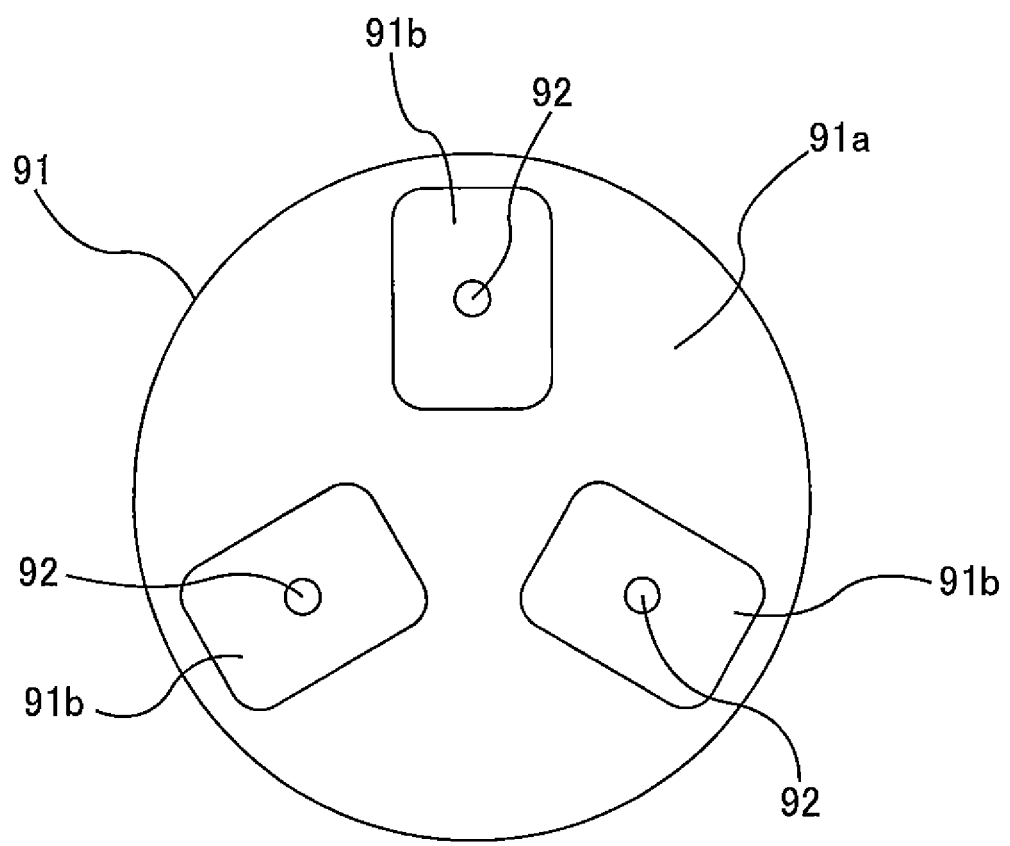
FIG. 22 is a plan view of a support stage of the hydrostatic support mechanism.

FIG. 22 is a plan view of the support stage 91. As shown in FIG. 22, the recesses 91b are arranged at equal intervals along a circumferential direction of the support stage 91. The support stage 91 is disposed below the wafer W held by the substrate rotating mechanism 10 so that the recesses 91b face the lower surface of the wafer W. The support shaft 93 is vertically movably supported by a linear-motion guide (ball spline) 97. The support shaft 93 has its lower portion coupled to a stage elevating device 98. This stage elevating device 98 is configured to elevate the support stage 91 until the substrate support surface (i.e., the upper surface) 91a reaches a position in proximity to the lower surface of the wafer W.

The hydrostatic support mechanism 90 further includes a stage rotating mechanism 99. This stage rotating mechanism 99 has: a pulley p3 mounted to an outer circumferential surface of the linear-motion guide 97, a motor M3, a pulley p4 fixed coaxially to a rotational shaft of the motor M3, and a belt b2 riding on the pulleys p3 and p4. This stage rotating mechanism 99 is configured to rotate the support stage 91 about the support shaft 93, i.e., the center of the substrate support surface 91a.

The fluid is continuously supplied into the recesses 91b from the fluid source 96 through the fluid supply passages 92. The fluid overflows the recesses 91b to flow through a gap (space) between the lower surface of the wafer W and the substrate support surface 91a of the support stage 91. The gap is filled with the fluid, so that the wafer W is supported by the fluid pressure. The wafer W and the support stage 91 are kept out of contact with each other with a clearance in a range of 50 μm to 500 μm. Since the hydrostatic support mechanism 90 supports the wafer W via the fluid pressure without contacting the wafer W, any damage to micro devices formed on the lower surface of the wafer W can be prevented. The fluid used in the hydrostatic support mechanism 90 may be a liquid, such as pure water. While the support stage 91 illustrated in FIG. 22 has three recesses 91b, the present invention is not limited to this embodiment. For example, the support stage 91 may have one recess or more than three recesses. The support stage 91 may have three to six recesses.

It is also possible to use as the fluid a gas (e.g., air or nitrogen) which is a compressible fluid, rather than the liquid which is an incompressible fluid. When the compressible fluid is used, the recesses 91b may be omitted. In this case, the fluid supply passages 92 have open ends thereof lying in flat substrate support surface 91a. The gas is supplied through the fluid supply passages 92 to the gap between the substrate support surface 91a and the wafer W to support the wafer W via the pressure of the gas such that the wafer W is kept out of contact with the substrate support surface 91a. The fluid supply passages 92 may have a number of open ends arranged over the substrate support surface 91a in its entirety.

The scrubbing surface of the scrubber 50 and the substrate support surface 91a of the hydrostatic support mechanism 90 are arranged symmetrically about the wafer W. Specifically, the scrubbing surface of the scrubber 50 and the substrate support surface 91a of the hydrostatic support mechanism 90 are arranged such that the wafer W is interposed therebetween. The load applied from the scrubber 50 to the wafer W is supported from right below the scrubber 50, i.e., from the opposite side of the scrubber 50, by the hydrostatic support mechanism 90. Therefore, the scrubber 50 can exert a large load on the upper surface of the wafer W. As shown in FIG. 4, the scrubbing surface and the substrate support surface 91a are arranged concentrically to each other. The scrubber 50 may be arranged such that an edge portion of the scrubbing surface is located on the center of the wafer W. The diameter of the scrubbing surface may be equal to or slightly smaller than the radius of the wafer W. The diameter of the scrubbing surface and the diameter of the substrate support surface 91a are approximately the same. In this embodiment, the diameter of the substrate support surface 91a is slightly smaller than the diameter of the scrubbing surface, whereas the diameter of the substrate support surface 91a may be equal to or larger than the diameter of the scrubbing surface.

Next, operations of the substrate processing apparatus according to the above-described embodiment will be described below. The scrubber 50 is moved to the retreat position outside of the substrate rotating mechanism 10. In this state, the wafer W is transported to a position above the substrate rotating mechanism 10 by a non-illustrated transfer device. The lift mechanism 30 elevates the chucks 11 and the wafer W is placed on the upper ends of the chucks 11. When the chucks 11 are lowered, the wafer W is held by the clamps 40 of the chucks 11. The wafer W is held such that the surface with no device faces upward and the surface with devices formed thereon faces downward. Depending on the purpose of substrate processing, the wafer W may be held by the substrate rotating mechanism 10 such that the surface with devices formed thereon faces upward and the surface with no device faces downward.

The scrubber 50 is moved from the retreat position to the processing position. The wafer W is rotated at a predetermined speed by the substrate rotating mechanism 10. A rotational speed of the wafer W when the scrubber 50 is performing substrate processing may be in the range of 300 to 600 rotations per min. The support stage 91 is elevated by the stage elevating device 98 until the substrate support surface 91a is located close to the lower surface of the wafer W. Then, the fluid, which may be pure water, is continuously supplied into the recesses 91b to support the wafer W via the fluid pressure. While supporting the wafer W, the support stage 91 is rotated by the stage rotating mechanism 99. A rotational speed of the support stage 91 may be in the range of 20 to 100 rotations per min.

The scrubber 50 is rotated by the scrubber rotating mechanism 58, and lowered by the scrubber elevating mechanism 52 until the cleaning tapes 61 are brought into contact with the upper surface of the wafer W. The upper surface of the wafer W is processed by the scrubbing surface formed by the cleaning tapes 61 that rotate about the central axis of the scrubber 50, while the pure water as the processing liquid is supplied onto the upper surface of the wafer W from the cleaning liquid supply nozzle 27. The processing liquid may be a polishing liquid containing abrasive grains, instead of the pure water. The cleaning tapes 61 may be cleaning tapes having abrasive grains fixed to their surfaces. Without using the processing liquid, the cleaning tapes 61 in a dry state may be placed in sliding contact with the wafer W.

During the scrubbing process, the wafer W is supported from below by the hydrostatic support mechanism 90. In this state, the scrubber 50 brings the cleaning tapes 61 into sliding contact with the upper surface of the wafer W while rotating the cleaning tapes 61 about the central axis of the scrubber 50 to thereby remove the foreign substances deposited on the upper surface of the wafer W and the scratches on the upper surface of the wafer W. Since the wafer W is supported by the hydrostatic support mechanism 90, the scrubber 50 can bring the cleaning tapes 61 into sliding contact with the upper surface of the wafer W at a large load. Accordingly, the scrubber 50 can remove relatively large foreign substances and foreign substances firmly stuck into the surface of the wafer W which could not be removed by a conventional cleaning apparatus.

The scrubber 50 and the wafer W are rotated in the same direction. The rotational speed of the scrubber 50 is selected such that relative speed between the wafer W and the cleaning tapes 61 is the same in all portions of the cleaning tapes 61 contacting the wafer W. The rotational speed of the scrubber 50 is determined depending on the rotational speed of the wafer W. Specifically, a ratio of the rotational speed of the scrubber 50 to the rotational speed of the wafer W is such that the relative speed between the wafer W and the cleaning tapes 61 is the same in all wafer portions of the cleaning tapes 61. For example, when the rotational speed of the wafer W is 500 rotations per min and the rotational speed of the scrubber 50 is 150 rotations per min, the relative speed between the wafer W and the cleaning tapes 61 becomes uniform. Such a speed ratio can be determined by known calculation or simulation. By rotating the scrubber 50 and the wafer W at such a rotational speed ratio, the upper surface of the wafer W in its entirety can be processed uniformly. Therefore, the substrate processing apparatus according to the present embodiment can process the surface of the wafer W in its entirety from the center to the peripheral edge thereof more uniformly than a conventional pen-sponge cleaning machine in which a pen brush is rotated about its own axis and a conventional roll sponge cleaning machine in which a roll sponge is rotated about its own axis.

After the scrubbing process is finished, the scrubber 50 is moved to the retreat position, and the supply of the fluid to the support stage 91 is stopped. The support stage 91 is then lowered by the stage elevating device 98 to a predetermined position. This predetermined lowered position may be located away from the lower surface of the wafer W by a distance in the range of 30 mm to 50 mm. In this lowered position, the support stage 91 is rotated at a low speed (e.g., in the range of 10 to 50 rotations per min), while the substrate support surface 91*a* of the support stage 91 is supplied with a rinsing liquid, e.g., pure water, from a rinsing liquid supply nozzle (not shown). In this manner, the substrate support surface 91*a* is rinsed with the rinsing liquid in the lowered position.

After the support stage 91 is lowered, the pure water as the cleaning liquid is supplied to the upper surface of the wafer W from the cleaning liquid supply nozzle 27 while the wafer W is rotated to wash away the debris produced in the scrubbing process. Thereafter, if necessary, a fluid mixture of a liquid and a compressed gas may be supplied to the upper surface of the wafer W from a two-fluid jet nozzle 100 so as to remove fine foreign substances and debris which could not be removed by the scrubber 50. The two-fluid jet nozzle 100 is disposed above the wafer W. During cleaning of the wafer W, the wafer W may be supported by the hydrostatic support mechanism 90.

Figure 23:
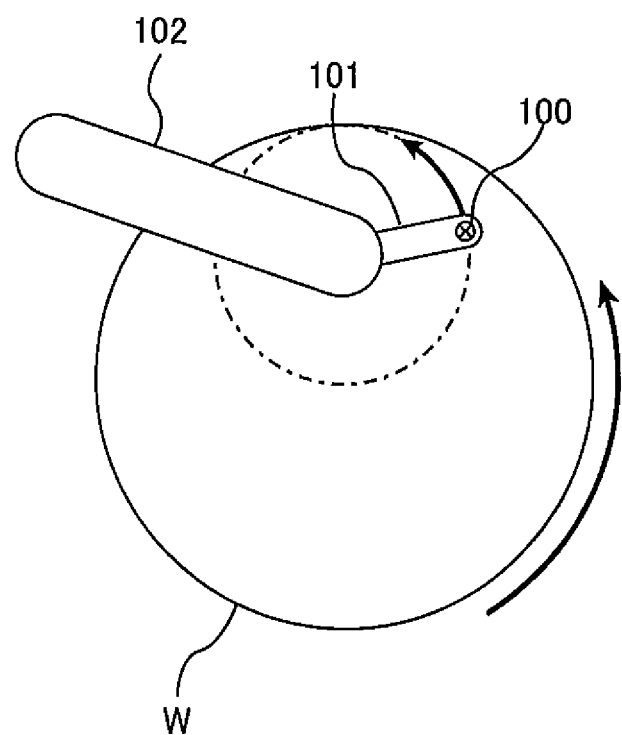
FIG. 23 is a plan view illustrating motions of a two-fluid jet nozzle.

FIG. 23 is a plan view illustrating the motions of the two-fluid jet nozzle 100. As shown in FIG. 23, the two-fluid jet nozzle 100 is mounted to a distal end of a rotary arm 101 whose proximal end is rotatably coupled to a swing arm 102. The swing arm 102 houses therein a rotating mechanism (not shown) for rotating the rotary arm 101 in a horizontal plane. Therefore, together with the rotatable arm 101, the two-fluid jet nozzle 100 is rotated above the wafer W by the rotating mechanism. The liquid and the gas are supplied to the two-fluid jet nozzle 100, which supplies a jet of the fluid mixture of the liquid and the gas onto the upper surface of the wafer W. The two-fluid jet nozzle 100 rotates along a circular path, indicated by a dot-and-dash line, which has a diameter slightly larger than the radius of the wafer W. Therefore, the upper surface of the wafer W in its entirety can be cleaned by the jet of the fluid mixture.

In this embodiment, the cleaning liquid supply nozzle 27 and the two-fluid jet nozzle 100 constitute a cleaner for cleaning the wafer W. As shown in FIG. 4, the cleaning liquid supply nozzle 27 and the two-fluid jet nozzle 100 are disposed in the processing chamber 7. The cleaning liquid supply nozzle 27 also functions as a processing liquid supply nozzle for supplying the processing liquid to the wafer W when the wafer W is scrubbed. In another embodiment, a processing liquid supply nozzle may be provided separately from the cleaning liquid supply nozzle 27, as shown in FIGS. 3A and 3B.

The wafer W that has been cleaned is then rotated at a high speed by the substrate rotating mechanism 10, so that the wafer W is spin-dried. In this spin-dry process, the wafer W is rotated at a speed in the range of 1500 to 3000 rotations per min. Since no rotating element exists below the wafer W when being dried on the hollow substrate rotating mechanism 10, watermarks due to droplets and attachment of the foreign substances can be prevented. After the wafer W is dried, the chucks 11 are elevated by the lift mechanism 30, releasing the wafer W therefrom. The wafer W is removed from the substrate processing apparatus by the transfer device (not shown). In this manner, the substrate processing apparatus according to the embodiment is capable of successively scrubbing, cleaning or rinsing, and drying the wafer W while holding the wafer W by the substrate rotating mechanism 10. Therefore, attachment of the foreign substances to the wafer W when transported and diffusion of contaminations from the wet wafer W to a transfer path can be prevented. Moreover, a process tact time can be reduced.

Figure 24:
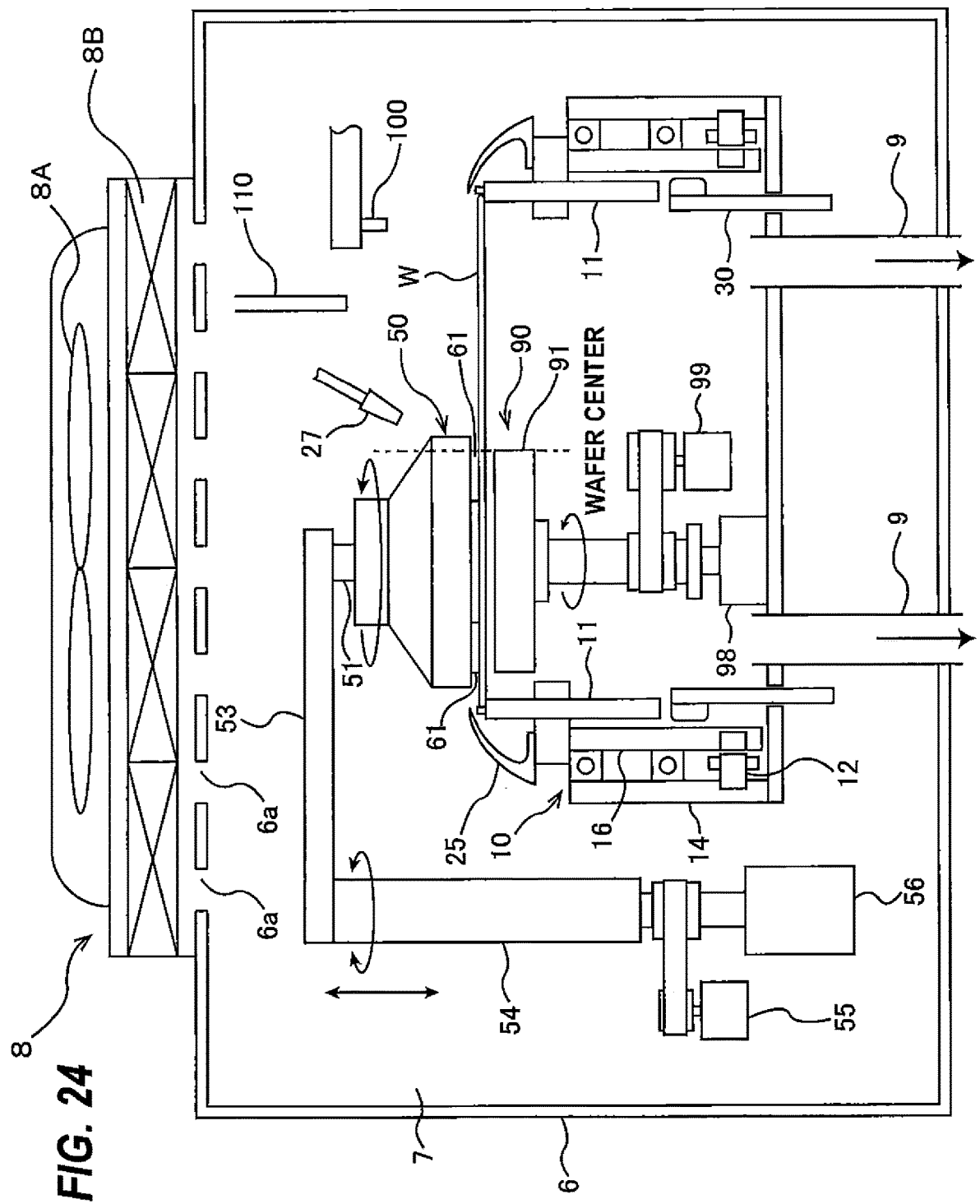
FIG. 24 is a view showing an example of the substrate processing apparatus including a drying liquid supply nozzle.

As described above, the substrate rotating mechanism 10 functions as a drier for drying the cleaned wafer W. The substrate processing apparatus may additionally have, as the drier, a mechanism for drying the wafer W by supplying a low-vapor-pressure solvent to the wafer W. FIG. 24 is a side view showing an example of the substrate processing apparatus having a drying liquid supply nozzle 110 for supplying the low-vapor-pressure solvent onto the upper surface of the wafer W. As shown in FIG. 24, the drying liquid supply nozzle 110 is disposed above the wafer W held by the substrate rotating mechanism 10. This drying liquid supply nozzle 110, which is located in the processing chamber 7, is movable in the radial direction of the wafer W. While moving in the radial direction of the wafer W, the drying liquid supply nozzle 110 supplies the low-vapor-pressure solvent to the upper surface of the wafer W. The cleaning liquid on the wafer W is replaced with the low-vapor-pressure solvent, which is then evaporated to dryness, whereby the wafer W is dried. The low-vapor-pressure solvent may be isopropyl alcohol, for example.

Figure 25:
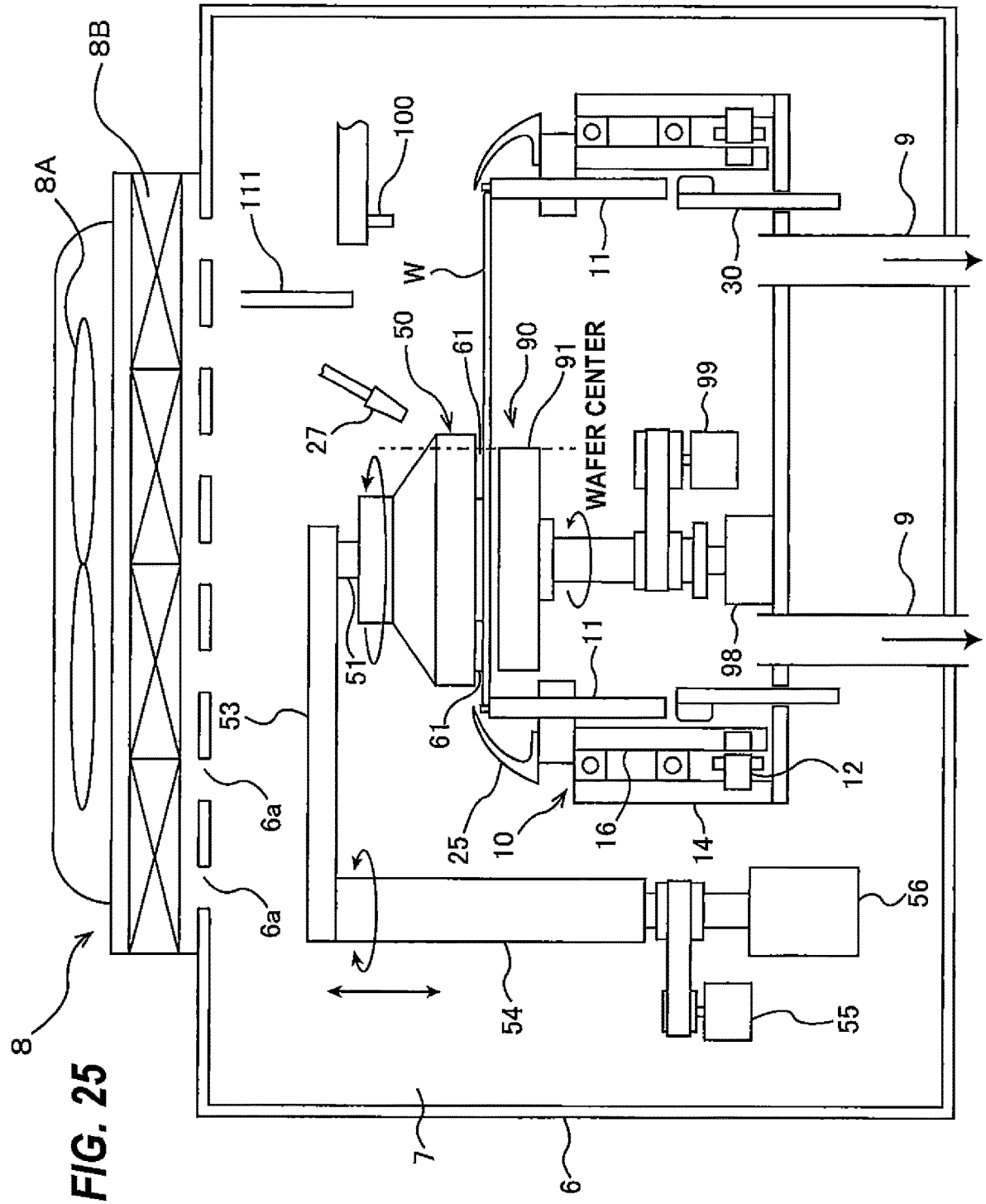
FIG. 25 is a view showing an example of the substrate processing apparatus including a drying gas supply nozzle.

FIG. 25 is a side view showing another example of the substrate processing apparatus having a drying gas supply nozzle 111 instead of the drying liquid supply nozzle. As shown in FIG. 25, the drying gas supply nozzle 111 is disposed above the wafer W held by the substrate rotating mechanism 10. The drying gas supply nozzle 111 is movable in the radial direction of the wafer W. While moving in the radial direction of the wafer W, the drying gas supply nozzle 111 supplies a drying gas to the upper surface of the wafer W to thereby dry the wafer W. The drying gas may be highly pure nitrogen, clean air, or the like.

Figure 26A:
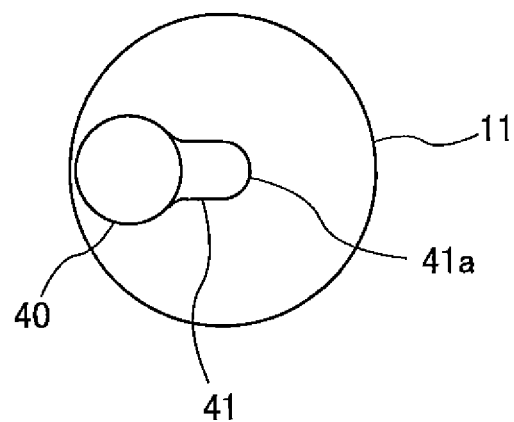
FIG. 26A is a plan view showing a clamp of a chuck.
Figure 26B:
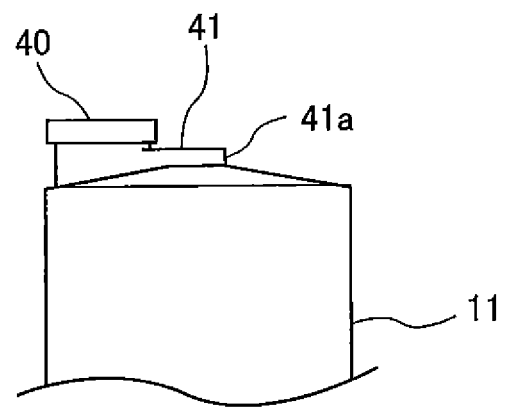
FIG. 26B is a side view of the clamp.

Structural details of the substrate rotating mechanism 10 will be described below. FIG. 26A is a plan view showing the clamp 40 of the chuck 11, and FIG. 26B is a side view of the clamp 40. As shown in FIGS. 26A and 26B, the clamp 40 is formed at the upper end of the chuck 11. This clamp 40 has a circular or cylindrical horizontal cross section and is arranged so as to contact the peripheral edge of the wafer W to thereby hold the wafer W. The chuck 11 has a positioning portion 41 extending from the clamp 40 to the central axis of the chuck 11. One end of the positioning portion 41 is connected integrally to a side surface of the clamp 40 and the other end is located on the central axis of the chuck 11. This center-side end of the positioning portion 41 has a curved side surface 41a extending along a circle which is concentric with the chuck 11. The upper end of the chuck 11 has a tapered surface inclined downwardly along the radially outward direction.

Figure 27A:
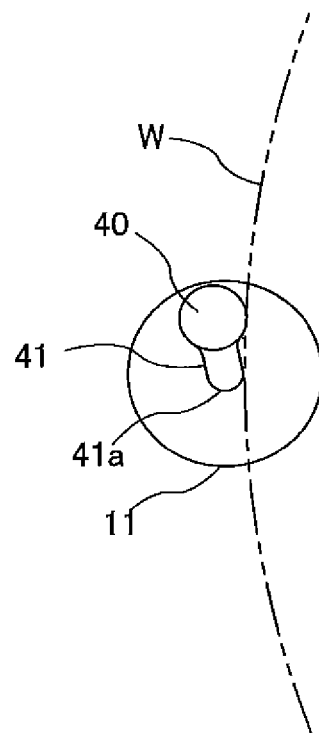
FIG. 27A is a plan view of the clamp when holding a wafer.
Figure 27B:
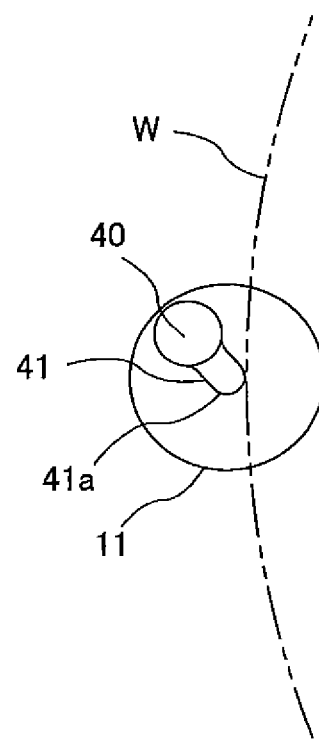
FIG. 27B is a plan view of the clamp when releasing the wafer.

FIG. 27A is a plan view of the clamp 40 when holding the wafer W, and FIG. 27B is a plan view of the clamp 40 when releasing the wafer W. The wafer W is placed on the upper end (the tapered surface) of each chuck 11. When the chuck 11 is rotated in one direction, the clamp 40 is brought into contact with the peripheral edge of the wafer W to thereby hold the wafer W, as shown in FIG. 27A. When the chuck 11 is rotated in the opposite direction, the clamp 40 is separated from the wafer W to thereby release the wafer W, as shown in FIG. 27B. At this time, the peripheral edge of the wafer W is placed in contact with the curved side surface 41a of the center-side end of the positioning portion 41. This curved side surface 41a of the positioning portion 41 can restrict a displacement of the wafer W which occurs when the chuck 11 rotates. As a result, subsequent wafer transferring operations can be performed stably.

Figure 28A:
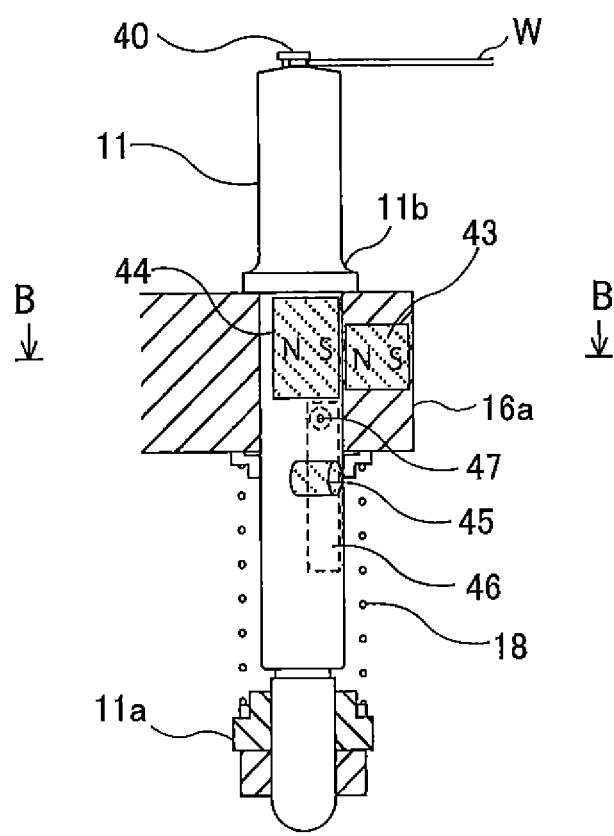
FIG. 28A is a cross-sectional view taken along line A-A in FIG. 6.
Figure 28B:
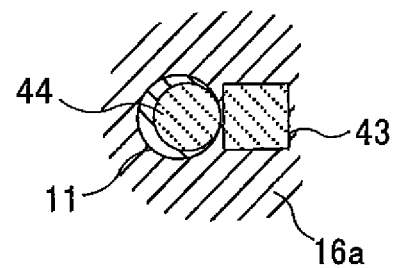
FIG. 28B is a cross-sectional view taken along line B-B in FIG. 28A.

FIG. 28A is a cross-sectional view taken along line A-A in FIG. 6, and FIG. 28B is a cross-sectional view taken along line B-B in FIG. 28A. The annular flange 16a of the rotary base 16 has a plurality of vertical through-holes in which the chucks 11 are inserted, respectively. Each through-hole has a diameter slightly larger than the diameter of the chuck 11. Therefore, the chuck 11 inserted in the through-hole is vertically movable relative to the rotary base 16 and is rotatable about its central axis.

The spring stopper 11a is secured to the lower end of each chuck 11. The spring 18, disposed around the chuck 11, is supported by the spring stopper 11a. An upper end of the spring 18 presses the flange 16a of the rotary base 16 upwardly. Therefore, the spring 18 exerts a downward force on the chuck 11. The chuck 11 has a chuck stopper 11b on the circumferential surface thereof above the rotary base 16. This chuck stopper 11b has a diameter larger than the diameter of the through-hole in the flange 16a. Therefore, a downward movement of the chuck 11 is limited by the chuck stopper 11b, as shown in FIG. 28A.

A first magnet 43 is embedded in the rotary base 16 so as to face a side surface of the chuck 11. A second magnet 44 and a third magnet 45 are provided in the chuck 11. The second magnet 44 and the third magnet 45 are arranged away from each other in the vertical direction. The first, second, and third magnets 43, 44, and 45 may be neodymium magnets.

Figure 29:
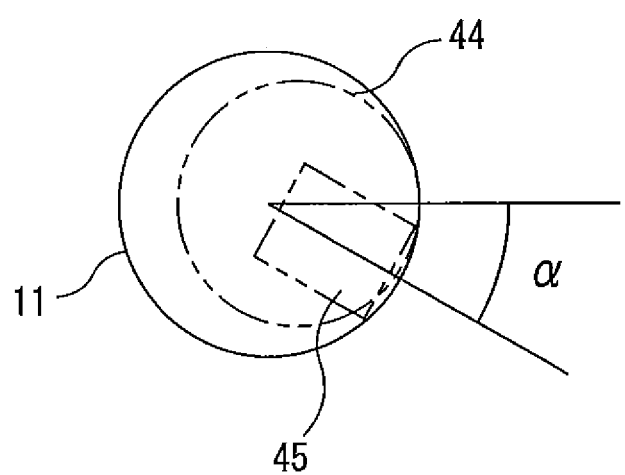
FIG. 29 is a schematic view illustrating arrangement of a second magnet and a third magnet, as viewed from an axial direction of the chuck.

FIG. 29 is a schematic view showing the arrangement of the second magnet 44 and the third magnet 45, as viewed from the axial direction of the chuck 11. As shown in FIG. 29, the second magnet 44 and the third magnet 45 are arranged in different positions with respect to the circumferential direction of the chuck 11. Specifically, a line interconnecting the center of the second magnet 44 and the center of the chuck 11 and a line interconnecting the center of the third magnet 45 and the center of the chuck 11 intersect at a predetermined angle α as viewed from the axial direction of the chuck 11.

When the chuck 11 is in the lowered position shown in FIG. 28A, the first magnet 43 and the second magnet 44 face each other. As a result, an attractive force acts between the first magnet 43 and the second magnet 44. This attractive force generates a force of rotating the chuck 11 about its central axis in a direction such that the clamp 40 presses the peripheral edge of the wafer W. Accordingly, the lowered position shown in FIG. 28B is a clamp position at which the wafer W is held (clamped).

Figure 30A:
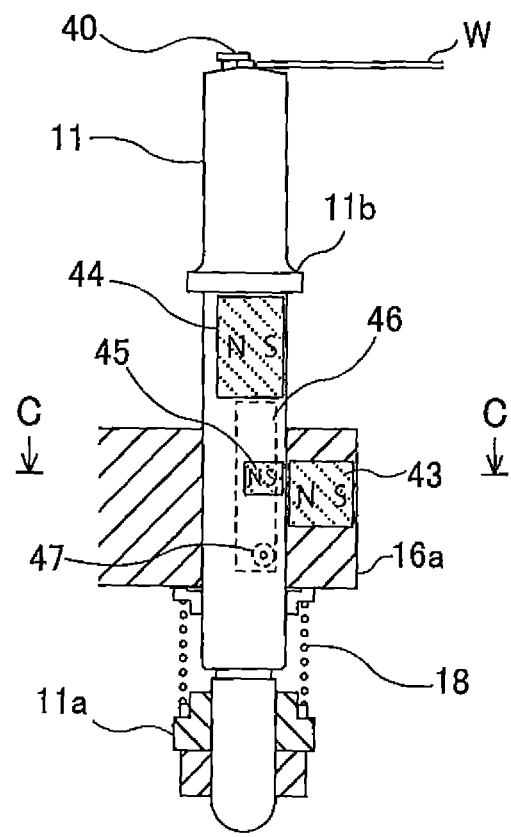
FIG. 30A is a cross-sectional view taken along the line A-A in FIG. 6 when the chuck is elevated by a lift mechanism.
Figure 30B:
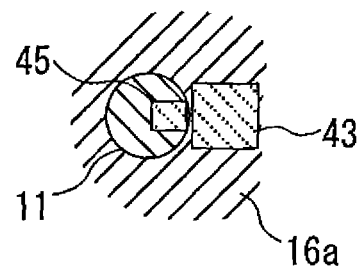
FIG. 30B is a cross-sectional view taken along line C-C in FIG. 30A.

FIG. 30A is a cross-sectional view taken along the line A-A in FIG. 6 when the chuck 11 is elevated by the lift mechanism 30, and FIG. 30B is a cross-sectional view taken along line C-C in FIG. 30A. When the chuck 11 is elevated by the lift mechanism 30 to the elevated position shown in FIG. 30A, the first magnet 43 and the third magnet 45 face each other, while the second magnet 44 is moved away from the first magnet 43. As a result, an attractive force acts between the first magnet 43 and the third magnet 45. This attractive force generates a force of rotating the chuck 11 about its central axis in a direction such that the clamp 40 moves away from the wafer W. Accordingly, the elevated position shown in FIG. 30A is an unclamp position at which the wafer W is released (unclamped).

Because the second magnet 44 and the third magnet 45 are arranged in different positions with respect to the circumferential direction of the chuck 11, the rotating force acts on the chuck 11 as the chuck 11 moves up and down. This rotating force imparts a force of holding the wafer W and a force of releasing the wafer W to the clamp 40. Therefore, by just moving the chuck 11 vertically, the clamp 40 can hold and release the wafer W. In this manner, the first magnet 43, the second magnet 44, and the third magnet 45 function as a holding mechanism (clamp mechanism) for holding the wafer W by rotating the chuck 11 about its central axis to cause the clamp 40 to hold the wafer W. This holding mechanism is actuated by the vertical movement of the chuck 11.

The chuck 11 has an axially extending groove 46 formed on a side surface thereof. The groove 46 has a circular arc horizontal cross-sectional shape. The flange 16a of the rotary base 16 has a protrusion 47 projecting into the groove 46. This protrusion 47 has its tip end located within the groove 46 and loosely engaging the groove 46. The groove 46 and the protrusion 47 serve to limit the rotation angle of the chuck 11.

Figure 31:
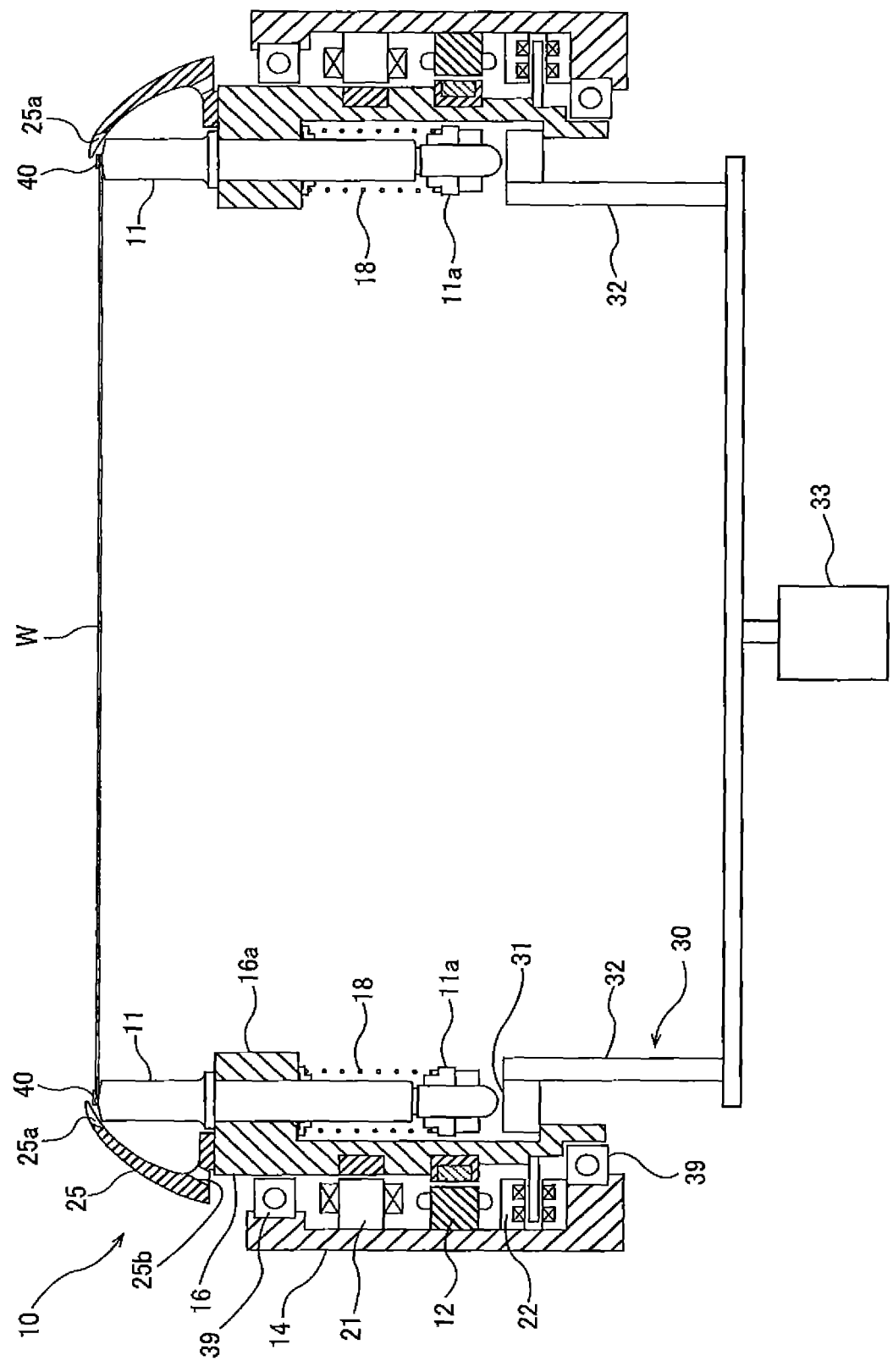
FIG. 31 is a cross-sectional view showing another example of the substrate rotating mechanism.

FIG. 31 is a cross-sectional view showing another example of the substrate rotating mechanism 10. In this example, magnetic bearings 21 and 22 are used instead of the angular contact ball bearings 20 shown in FIG. 5. The rotary base 16 is rotatably supported by the magnetic bearing 21 which is a radial magnetic bearing and the magnetic bearing 22 which is an axial magnetic bearing. A touchdown bearing 30 is disposed above the radial magnetic bearing 21 and another touchdown bearing 30 is disposed below the axial magnetic bearing 22. Since the rotary base 16 is kept out of contact by the magnetic bearings 21 and 22, no particles are produced when the wafer W is in rotation and hence the wafer W is maintained in a clean atmosphere.

Figure 32:
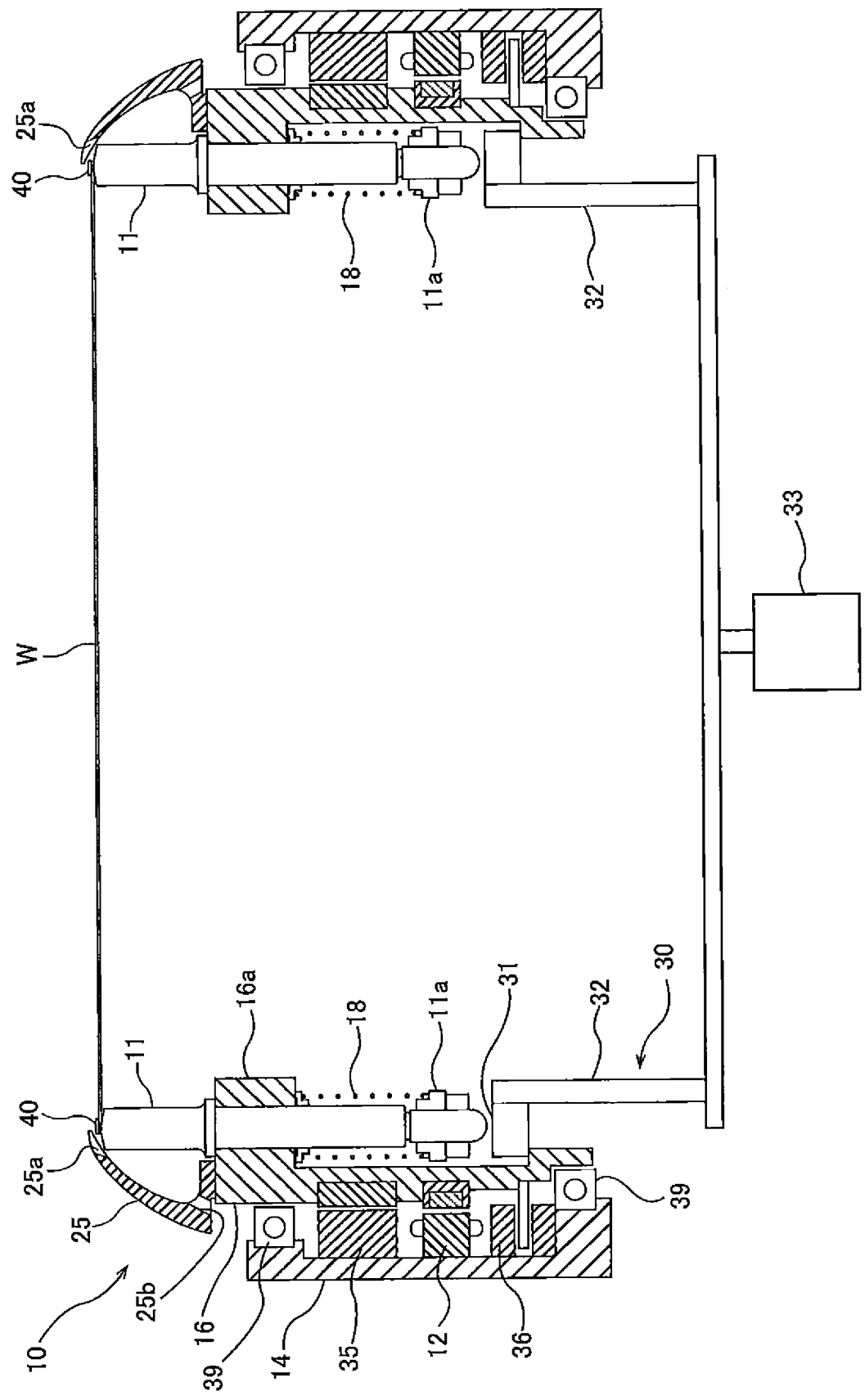
FIG. 32 is a cross-sectional view showing still another example of the substrate rotating mechanism.

FIG. 32 is a cross-sectional view showing still another example of the substrate rotating mechanism 10. In this example, non-contact gas bearings 35 and 36 are used instead of the angular contact ball bearings 20 shown in FIG. 5. The rotary base 16 is rotatably supported by the gas bearing 35 which is a radial gas bearing and the gas bearing 36 which is an axial gas bearing. A touchdown bearing 39 is disposed above the radial gas bearing 35 and another touchdown bearing 39 is disposed below the axial gas bearing 36. Since the rotary base 16 is kept out of contact by the gas bearings 35 and 36, no particles are produced when the wafer W is in rotation and hence the wafer W is maintained in a clean atmosphere. The gas bearings 35 and 36 may be hydrostatic gas bearings or dynamic pressure gas bearings. The stationary member 14 has an exhaust port (not shown) defined therein. A gas from the gas bearings 35 and 36 is discharged through the exhaust port. Therefore, heat generated by the hollow motor 12 can be released out of the substrate rotating mechanism 10 together with the gas, so that distortion of the rotary base 16 and other components due to heat can be prevented. As a result, rotational accuracy of the substrate rotating mechanism 10 can be increased. The substrate rotating mechanism 10 can therefore rotate the wafer W at a higher speed to thereby dry the wafer W in a shortened period of time.

Figure 33:
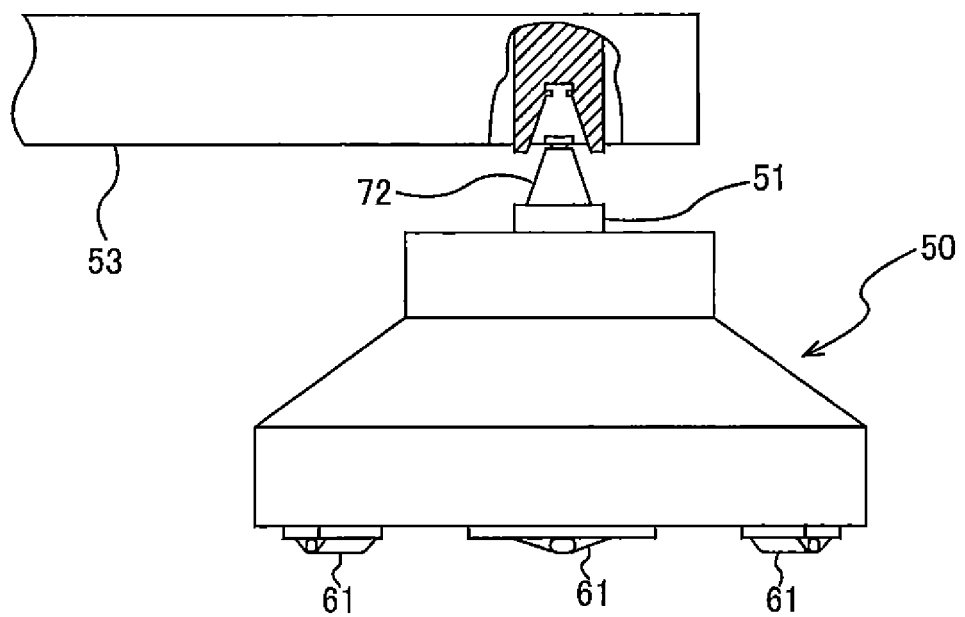
FIG. 33 is a side view showing another example of the scrubber.
Figure 34:
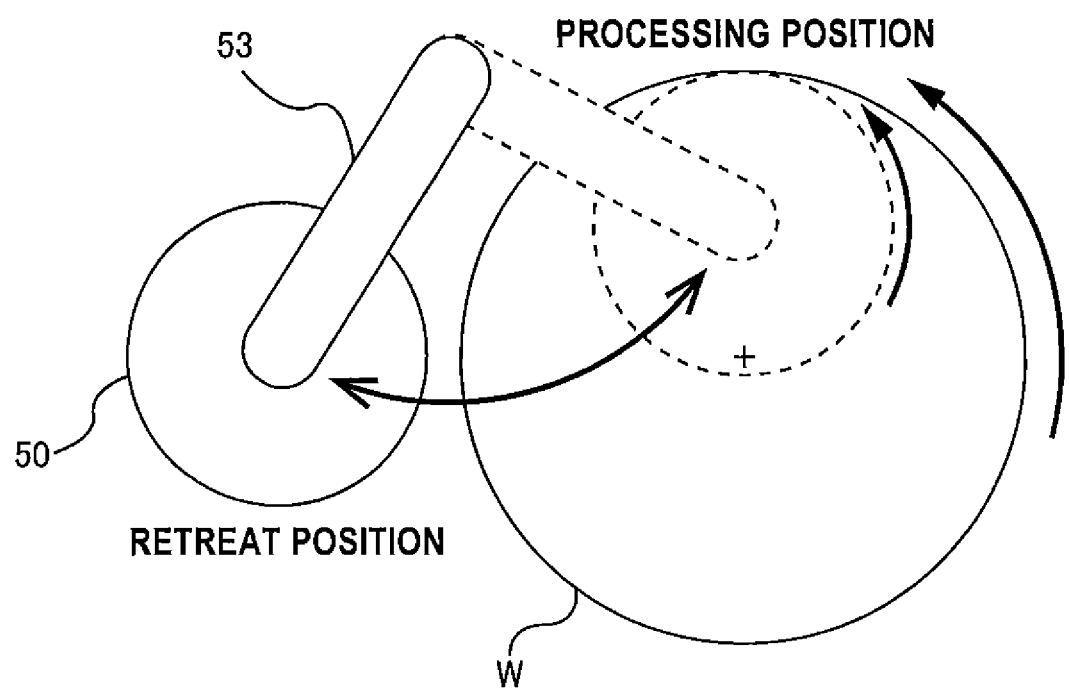
FIG. 34 is a plan view of the scrubber and the wafer.

FIG. 33 is a side view of another example of the scrubber 50. The scrubber 50 in this example is coupled to the swing arm 53 through a chuck mechanism (or coupling) 72, which is provided on the scrubber shaft 51. This chuck mechanism 72 is configured such that the scrubber shaft 51 can be separated from the swing arm 53 through the chuck mechanism 72. Therefore, the scrubber 50 can be detached in its entirety from the swing arm 53 for replacement of the tape cartridges 60. The scrubber 50 is detached when the scrubber 50 is in the retreat position, as shown in FIG. 34.

In the embodiments described thus far, the scrubber 50 is disposed at the upper side of the wafer W, while the hydrostatic support mechanism 90 is disposed at the lower side of the wafer W. In another embodiment, the scrubber 50 may be disposed at the lower side of the wafer W, while the hydrostatic support mechanism 90 may be disposed at the upper side of the wafer W. According to this alternative embodiment, a throughput can be increased because the wafer does not need to be inverted. In still another embodiment, two scrubbers 50 may be disposed at the upper side and the lower side of the wafer W so as to process both surfaces of the wafer W simultaneously. In this embodiment using the two scrubbers 50, the hydrostatic support mechanism 90 is not provided. The substrate rotating mechanism 10 may include a plurality of roll chucks which rotate about their central axes while holding the peripheral edge of the wafer. With the roll chucks used, the wafer cannot be spin-dried. Hence a separate drier is needed to dry the wafer.

Figure 35:
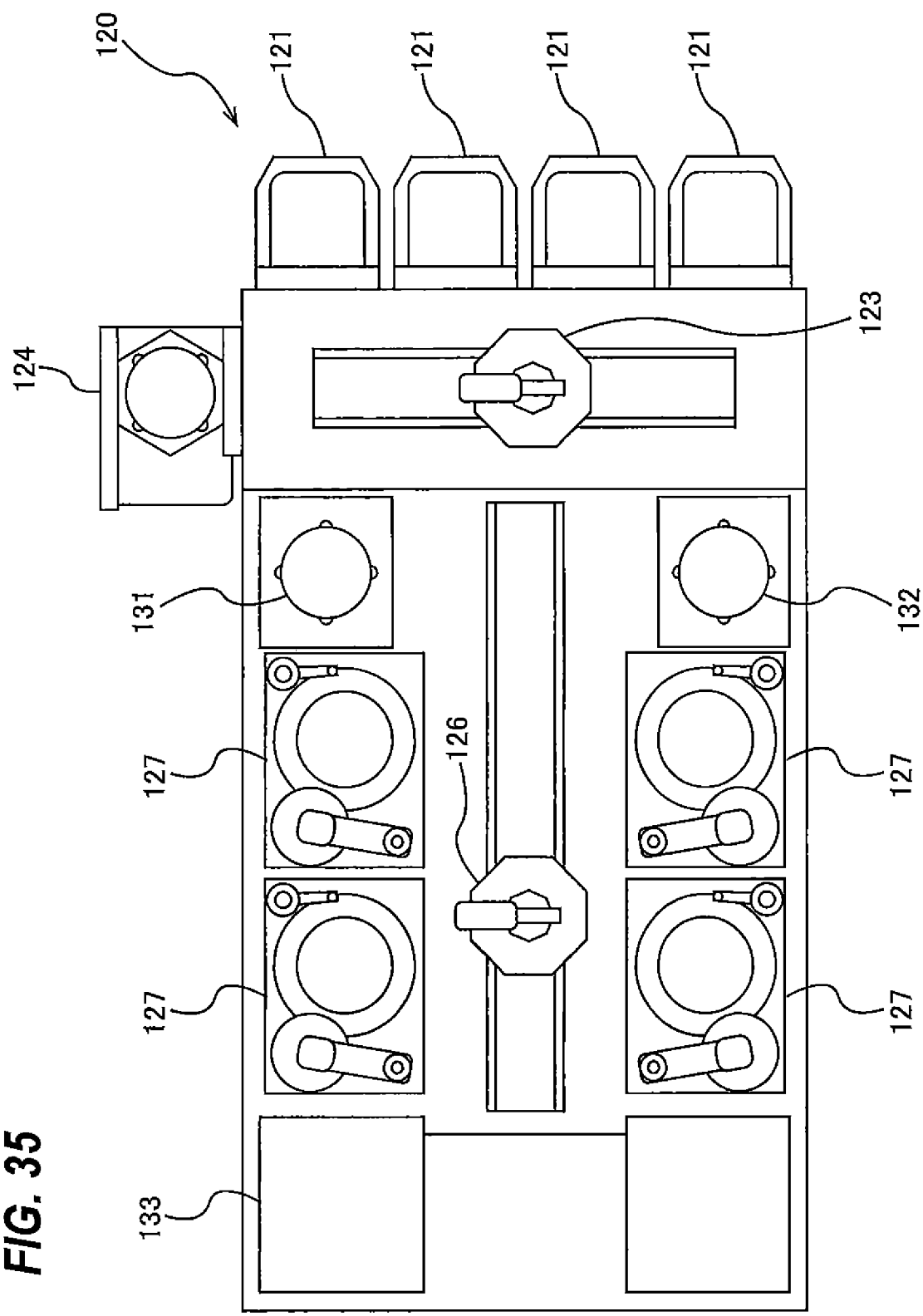
FIG. 35 is a plan view of a substrate processing system including a plurality of substrate processing apparatuses according to the embodiment of the present invention.

FIG. 35 is a plan view of a substrate processing system including a plurality of substrate processing apparatuses described above. As shown in FIG. 35, the substrate processing system has a loading and unloading section 120 including four front loaders 121 on which wafer cassettes, each storing a number of wafers therein, are placed. Each of the front loaders 121 is capable of receiving thereon an open cassette, an SMIF (Standard Manufacturing Interface) pod, or a FOUP (Front Opening Unified Pod). The SMIF and FOUP are a hermetically sealed container which houses a wafer cassette therein and covers it with a partition wall to thereby provide interior environments isolated from an external space.

The loading and unloading section 120 further includes a first transfer robot (loader) 123 movable along the array of the front loaders 121. The first transfer robot 123 can selectively access the wafer cassettes installed on the front loaders 121 and can remove the wafer from the wafer cassettes. A particle counter 124 is disposed adjacent to the first transfer robot 123. This particle counter 124 is a device for counting the number of foreign substances, i.e., particles, attached to the wafer surface. The particle counter 124 may be omitted.

The substrate processing system further includes: a second transfer robot 126 movable horizontally, a plurality of substrate processing apparatuses 127 arranged along a moving direction of the second transfer robot 126, a first wafer station 131 and a second wafer station 132 through which the wafer is transported between the first transfer robot 123 and the second transfer robot 126, and an operation controller 133 for controlling overall operations of the substrate processing system. In this example, the substrate processing system has four substrate processing apparatuses 127, which are arranged such that two substrate processing apparatuses 127 are installed on each side of the second transfer robot 126. The substrate processing system may include six or eight or more substrate processing apparatuses 127. When six substrate processing apparatuses 127 are provided, three substrate processing apparatuses 127 are disposed on each side of the second transfer robot 126. When eight substrate processing apparatuses 127 are provided, four substrate processing apparatuses 127 are disposed on each side of the second transfer robot 126.

The operations of the substrate processing system are as follows. The wafer is removed from the wafer cassette on one of the front loaders 121 by the first transfer robot 123 and carried to the particle counter 124. The particle counter 124 counts the number of particles (foreign substances) attached to the wafer surface, and sends the counted number to the operation controller 133. The operation controller 133 may change processing recipes at the substrate processing apparatus 127 depending on the counted number of particles. For example, if the counted number of particles is greater than a predetermined reference value, then the substrate processing apparatus 127 may increase a time of the scrubbing process.

The wafer is removed from the particle counter 124 by the first transfer robot 123 and then placed on the first wafer station 131. The second transfer robot 126 holds the wafer on the first wafer station 131, and transfers the wafer into either one of the four substrate processing apparatuses 127.

The substrate processing apparatus 127 processes the front-side surface or the backside surface of the wafer according to the operation sequence described above. If necessary, a secondary process may be performed on the processed wafer in another substrate processing apparatus 127. The processed wafer is carried from the substrate processing apparatus 127 to the second wafer station 132 by the second transfer robot 126. The wafer is further carried from the second wafer station 132 by the first transfer robot 123 to the wafer cassette and is returned to an original position where the wafer has been stored.

The substrate processing system can selectively perform a serial process in which the wafer is processed successively by the plurality of substrate processing apparatuses 127, a parallel process in which a plurality of wafers are processed in parallel by respective substrate processing apparatuses 127, and a serial-and-parallel process in which a plurality of wafers are processed by the plurality of substrate processing apparatuses 127 in serial and in parallel.

Figure 36:
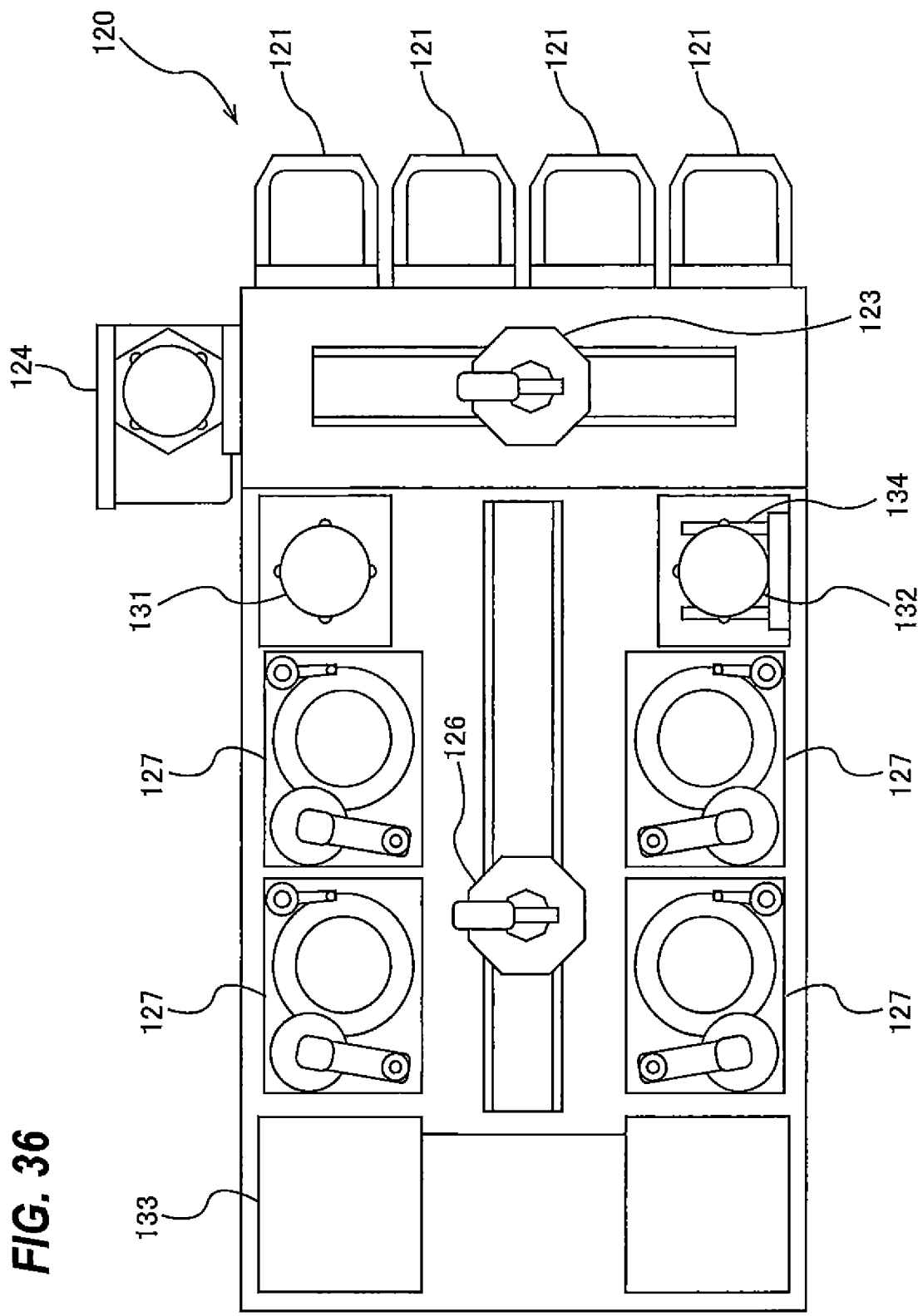
FIG. 36 is a plan view showing another example of the substrate processing system.

FIG. 36 is a plan view showing another example of the substrate processing system. The substrate processing system shown in FIG. 36 is essentially the same as the substrate processing system shown in FIG. 35 except that the second wafer station 132 has an inverting mechanism 134 for inverting the wafer. The wafer is carried from the wafer cassette to the second wafer station 132 by the first transfer robot 123, and inverted by the inverting mechanism 134 of the second wafer station 132. The inverted wafer is carried by the second transfer robot 126 to one of the substrate processing apparatuses 127, where the wafer is processed. The processed wafer is carried to the second wafer station 132 again and inverted by the inverting mechanism 134. Thereafter, the wafer is returned to the wafer cassette by the first transfer robot 123.

Figure 37:
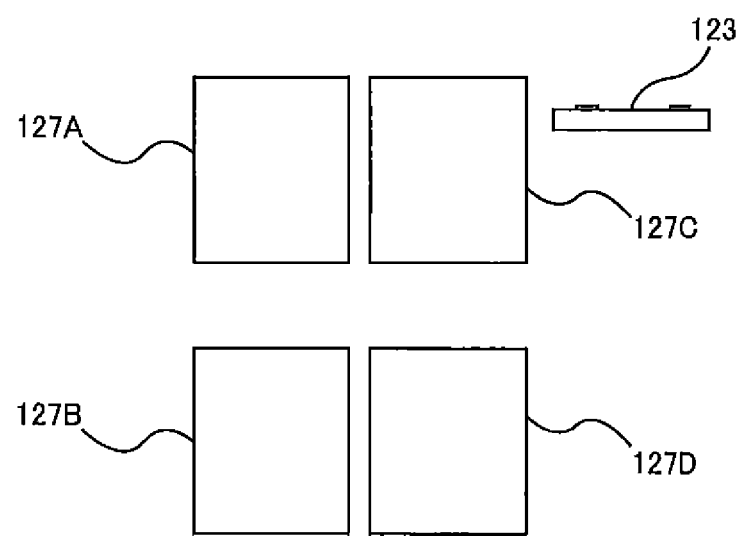
FIG. 37 is a side view of the substrate processing apparatuses arranged in upper and lower tiers.

In the substrate processing systems shown in FIGS. 35 and 36, the substrate processing apparatuses 127 are arranged in the same plane. Alternatively, the substrate processing apparatuses may be arrayed along the vertical direction. FIG. 37 is a side view of the substrate processing system having the substrate processing apparatuses arrayed in an upper tier and a lower tier. The substrate processing system shown in FIG. 37 includes a first upper substrate processing apparatus 127A, a first lower substrate processing apparatus 127B, a second upper substrate processing apparatus 127C, and a second lower substrate processing apparatus 127D. The first upper substrate processing apparatus 127A is disposed above the first lower substrate processing apparatus 127B, and the second upper substrate processing apparatus 127C is disposed above the second lower substrate processing apparatus 127D. The second transfer robot 126 shown in FIG. 37 is movable not only horizontally, but also vertically so as to carry the wafer between the first substrate processing apparatuses 127A and 127B, the second substrate processing apparatuses 127C and 127D, and the second wafer station 132.

Figure 38:
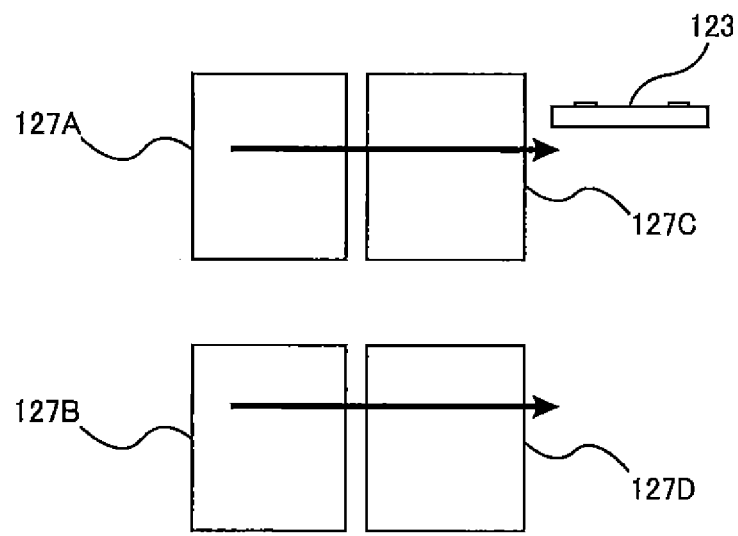
FIG. 38 is a side view illustrating wafer processing lines.
Figure 39:
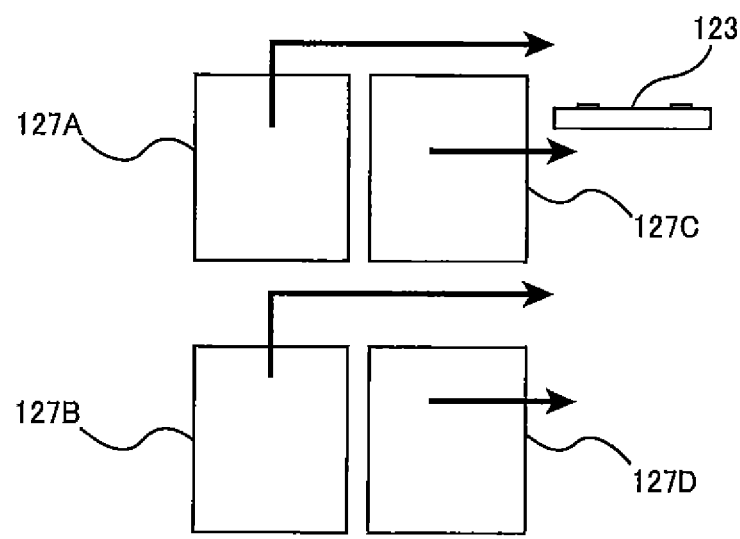
FIG. 39 is a side view illustrating wafer processing lines.

The substrate processing system shown in FIG. 37 is capable of providing various wafer processing lines. For example, as shown in FIG. 38, one of two wafers is transmitted to the upper substrate processing apparatuses 127A and 127C as a first processing line, and the other is transmitted to the lower substrate processing apparatuses 127B and 127D as a second processing line, so that the two wafers can be processed simultaneously. Alternatively, as shown in FIG. 39, four wafers may be transmitted to the respective four substrate processing apparatuses 127A, 127B, 127C, and 127D as first to fourth processing lines. While FIGS. 37 through 39 show the examples in which the substrate processing apparatuses are arranged in the two tiers, the substrate processing apparatuses may be arranged in three or more tiers.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate processing method for processing a substrate having a first surface and a second surface, the second surface being an opposite side of the first surface, comprising:

performing surface processing of the substrate by bringing at least one scrubbing tape into sliding contact with the first surface of the substrate while supporting the second surface of the substrate by a surface of a support stage via fluid pressure without contacting the substrate;

cleaning the substrate that has been subjected to the surface processing; and drying the cleaned substrate.

2. The substrate processing method according to claim 1, wherein the surface processing, the cleaning, and the drying are performed in a common processing chamber.

3. The substrate processing method according to claim 1, wherein cleaning the substrate comprises:

supporting the second surface of the substrate by the surface of the support stage via the fluid pressure without contacting the substrate.

4. The substrate processing method according to claim 1, wherein the first surface is a surface with no devices formed thereon, and the second surface is a surface with a device formed thereon.

5. The substrate processing method according to claim 1, wherein the first surface is a surface with devices formed thereon, and the second surface is a surface with no devices formed thereon.

6. The substrate processing method according to claim 1, wherein a material forming the first surface comprises silicon, a silicon compound, gallium, a gallium compound, metal, a metal compound, or an organic compound.

7. The substrate processing method according to claim 1, wherein the at least one scrubbing tape comprises a material softer than a material forming the first surface, a material containing abrasive grains, or a polishing tape.

8. The substrate processing method according to claim 1, wherein performing surface processing comprises:

bringing the at least one scrubbing tape into sliding contact with the first surface while supplying a processing liquid onto the first surface, the processing liquid containing at least one of a component capable of dissolving a material forming the first surface, abrasive grains, or a component for preventing reattachment of the material removed by the at least one scrubbing tape or reaction products.

9. The substrate processing method according to claim 8, wherein the abrasive grains comprise silicon dioxide, silicon carbide, silicon nitride, aluminum oxide, diamond, or a mixture of selected ones of these materials.

10. The substrate processing method according to claim 8, wherein the processing liquid is neutral or alkaline.

11. The substrate processing method according to claim 8, wherein the processing liquid is acidic.

12. The substrate processing method according to claim 1, wherein:
cleaning the substrate comprises supplying a cleaning liquid onto the first surface of the substrate and cleaning the first surface with a contact type or non-contact type cleaning technique; and
the cleaning liquid comprises a solution having a predetermined pH, a solution containing a component for preventing reattachment of a material once removed by the at least one scrubbing tape, or pure water.

13. The substrate processing method according to claim 12, wherein the cleaning liquid is neutral or alkaline.

14. The substrate processing method according to claim 12, wherein the cleaning liquid is acidic.

15. The substrate processing method according to claim 1, wherein drying the cleaned substrate comprises:
rotating the substrate at a high speed, supplying a gas to the first surface, or supplying a low-vapor-pressure solvent to the first surface.

16. The substrate processing method according to claim 1, wherein drying the cleaned substrate comprises:
holding the substrate by chucks which contact a peripheral edge of the substrate.

17. The substrate processing method according to claim 1, wherein performing surface processing comprises:
performing surface processing until the first surface has a surface roughness of 5 μm or smaller.

18. The substrate processing method according to claim 1, wherein said bringing the at least one scrubbing tape into sliding contact with the first surface of the substrate comprises rotating the at least one scrubbing tape on the first surface of the substrate.

19. The substrate processing method according to claim 1, wherein the at least one scrubbing tape comprises a plurality of scrubbing tapes.

20. The substrate processing method according to claim 19, wherein said bringing the at least one scrubbing tape into sliding contact with the first surface of the substrate comprises rotating the plurality of scrubbing tapes on the first surface of the substrate around a common axis.

* * * * *